(12) United States Patent
Cho et al.

(10) Patent No.: US 11,670,242 B2
(45) Date of Patent: Jun. 6, 2023

(54) ELECTRONIC DEVICE

(71) Applicant: SAMSUNG DISPLAY CO., LTD., Yongin-si (KR)

(72) Inventors: Hyun-Wook Cho, Yongin-si (KR); Min-Hong Kim, Hwaseong-si (KR); Taejoon Kim, Seongnam-si (KR); Jungmok Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/369,106

(22) Filed: Jul. 7, 2021

(65) Prior Publication Data
US 2022/0108660 A1 Apr. 7, 2022

(30) Foreign Application Priority Data

Oct. 5, 2020 (KR) .................. 10-2020-0128113

(51) Int. Cl.
*G09G 3/3275* (2016.01)
*G09G 3/3266* (2016.01)
*H01L 27/32* (2006.01)
*H01L 51/52* (2006.01)

(52) U.S. Cl.
CPC ......... *G09G 3/3275* (2013.01); *G09G 3/3266* (2013.01); *H01L 27/323* (2013.01); *H01L 27/326* (2013.01); *H01L 51/5237* (2013.01); *G09G 2310/027* (2013.01)

(58) Field of Classification Search
CPC . H01L 27/323; H01L 27/326; H01L 51/5237; G09G 3/3275; G09G 3/3266; G09G 2310/027
See application file for complete search history.

(56) References Cited

U.S. PATENT DOCUMENTS

| | | | |
|---|---|---|---|
| 9,316,856 B2 | 4/2016 | Park et al. | |
| 9,501,196 B2 | 11/2016 | Takeuchi et al. | |
| 10,963,089 B2* | 3/2021 | Murakami | G06F 3/041 |
| 2015/0145808 A1 | 5/2015 | Cho et al. | |
| 2017/0364184 A1* | 12/2017 | Weinerth | G06F 3/0443 |
| 2019/0279577 A1* | 9/2019 | Zhou | G09G 3/003 |
| 2020/0401258 A1* | 12/2020 | Kang | G09G 3/3275 |

FOREIGN PATENT DOCUMENTS

| | | |
|---|---|---|
| KR | 10-1721701 | 3/2017 |
| KR | 10-1878976 | 7/2018 |

\* cited by examiner

*Primary Examiner* — Nelson M Rosario
*Assistant Examiner* — Scott D Au
(74) *Attorney, Agent, or Firm* — F. Chau & Associates, LLC

(57) ABSTRACT

An electronic device includes display driver and a sensor driver. The display driver drives a display layer and provide a grayscale voltage to a data lines. The sensor driver is synchronized with the display driver to drive a sensor layer, and operates in a first sensing mode and a second sensing mode. In the first sensing mode, the sensor driver senses an input through the sensor layer based on a first timing. In the second sensing mode, the sensor driver senses an input through the sensor layer based on a second timing different from the first timing.

19 Claims, 20 Drawing Sheets

ELECTRONIC DEVICE

CROSS-REFERENCE TO RELATED APPLICATIONS

This U.S. non-provisional patent application claims priority under 35 U.S.C. § 119 of Korean Patent Application No. 10-2020-0128113, filed on Oct. 5, 2020, the entire contents of which are hereby incorporated by reference.

BACKGROUND

1. Field of the Disclosure

One or more embodiments described herein relate to an electronic device.

2. Background of the Related Art

Televisions, mobile phones, tablets, computers, navigation systems, game machines, and other types of electronic devices display images. Most of these devices have one or more ways of inputting information. Examples include buttons, keyboards and a mouse. Some devices include an input sensor capable of providing a touch-based input method for inputting information.

SUMMARY

One or more embodiments described herein provide an electronic device including a sensor layer having a proximity sensing function.

In accordance with one or more embodiments, an electronic device includes a display layer including a plurality of scan lines, a plurality of data lines, and a plurality of pixels; a display driver configured to drive the display layer and provide a grayscale voltage to the plurality of data lines; a sensor layer disposed on the display layer; and a sensor driver configured to be synchronized with the display driver to drive the sensor layer, wherein the sensor driver is configured to operate in a first sensing mode and a second sensing mode, and wherein: in the first sensing mode, the sensor driver is configured to sense an input through the sensor layer based on a first timing, and in the second sensing mode, the sensor driver is configured to sense an input through the sensor layer based on a second timing different from the first timing.

In an embodiment, the display driver may be configured to operate in a first display mode or a second display mode different from the first display mode, In the first display mode, the display driver may be configured to provide a scan signal to the plurality of scan lines in one frame section. In the second display mode, the display driver may be configured to provide a scan signal to a plurality of first scan lines among the plurality of scan lines in a first frame section and to provide a scan signal to a plurality of second scan lines among the plurality of scan lines in a second frame section.

In an embodiment, in the first display mode, the plurality of pixels may be charged with a voltage corresponding to the grayscale voltage.

In an embodiment, the plurality of pixels may include a plurality of first pixels connected to the plurality of first scan lines and a plurality of second pixels connected to the plurality of second scan lines. In the second display mode, the plurality of first pixels may be charged according to the grayscale voltage during the first frame section, and the plurality of second pixels may not be charged with the grayscale voltage during the first frame section.

In an embodiment, in the second display mode, the plurality of first pixels may not be charged with the grayscale voltage during the second frame section, and the plurality of second pixels may be charged according to the grayscale voltage during the second frame section.

In an embodiment, in the second display mode, a grayscale voltage provided to the plurality of second pixels during the first frame section and a grayscale voltage provided to the plurality of first pixels during the second frame section may be a black grayscale voltage or a white grayscale voltage.

In an embodiment, the display driver may be configured to output the grayscale voltage to the plurality of data lines in response to a level change time point of an output control signal, wherein a time interval between a timing at which the sensing driver outputs a driving signal to the sensor layer and the level change time point in the first sensing mode may be greater than a time interval between a timing at which the sensing driver outputs a driving signal to the sensor layer and the level change time point in the second sensing mode.

In an embodiment, the display driver may be configured to output the grayscale voltage to the plurality of data lines in response to a level change time point of an output control signal, wherein in the second sensing mode, a timing at which the sensing driver outputs a driving signal to the sensor layer and the level change time point may be substantially same In an embodiment, when the sensor driver is driven in the second sensing mode, the grayscale voltage may be provided to the plurality of data lines, and one or more of the plurality of pixels may not be charged with a voltage corresponding to the grayscale voltage.

In an embodiment, the grayscale voltage may be a black grayscale voltage or a white grayscale voltage.

In an embodiment, in the second sensing mode, the sensor driver may be configured to provide a driving signal to the sensor layer in a section having the largest noise by the display layer.

In an embodiment, the display driver may be configured to receive a vertical synchronization signal, and the sensor driver may be configured to operate in the second sensing mode in a vertical blank section of the vertical synchronization signal.

In an embodiment, the display driver may be configured to output a black grayscale voltage or a white grayscale voltage to the plurality of data lines in the vertical blank section.

In an embodiment, the second sensing mode may be a proximity sensing mode that detects an object (hovering object) spaced from the surface of the electronic device.

In an embodiment, the display layer may further include: a base layer; a circuit layer disposed on the base layer; a light emitting element layer disposed on the circuit layer; and a encapsulation layer disposed on the light emitting element layer to seal the light emitting element layer, wherein the sensor layer may be disposed in direct contact with the encapsulation layer.

In accordance with one or more embodiments, an electronic device includes a display layer configured to display an image and including a plurality of scan lines, a plurality of data lines, and a plurality of pixels a display driver configured to drive the display layer; a sensor layer disposed on the display layer; and a sensor driver configured to be synchronized with the display driver and driven in a first sensing mode or a second sensing mode having different timings for sensing an external input from the sensor layer. The display driver is configured to output a grayscale voltage to the plurality of data lines in response to a level change time point of an output control signal, and wherein a time interval between a timing of sensing the external input and a level change time point in the first sensing mode is greater than a time interval between a timing of sensing the external input and a level change time point in the second sensing mode.

In an embodiment, the display driver may be driven in a first display mode operating at a first frame rate and a second display mode operating at a second frame rate lower than the first frame rate, wherein the first sensing mode may be synchronized with the first display mode, and the second sensing mode may be synchronized with the second display mode.

In an embodiment, in the first display mode, the display driver may be configured to provide a scan signal to a plurality of scan lines of the display layer in one frame section, wherein in the second display mode, the display driver may be configured to provide a scan signal to a plurality of first scan lines among the plurality of scan lines in a first frame section and to provide a scan signal to a plurality of second scan lines among the plurality of scan lines in the second frame section.

In an embodiment, the plurality of pixels may include a plurality of first pixels connected to the plurality of first scan lines and a plurality of second pixels connected to the plurality of second scan lines, wherein in the second display mode, the plurality of first pixels may be charged according to the grayscale voltage during the first frame section, and the plurality of second pixels may not be charged with the grayscale voltage during the first frame section, wherein in the second display mode, the plurality of first pixels may not be charged with the grayscale voltage during the second frame section, and the plurality of second pixels may be charged according to the grayscale voltage during the second frame section.

In an embodiment, the display driver may be configured to receive a vertical synchronization signal, and the sensor driver may be configured to operate in the second sensing mode in a vertical blank section of the vertical synchronization signal.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
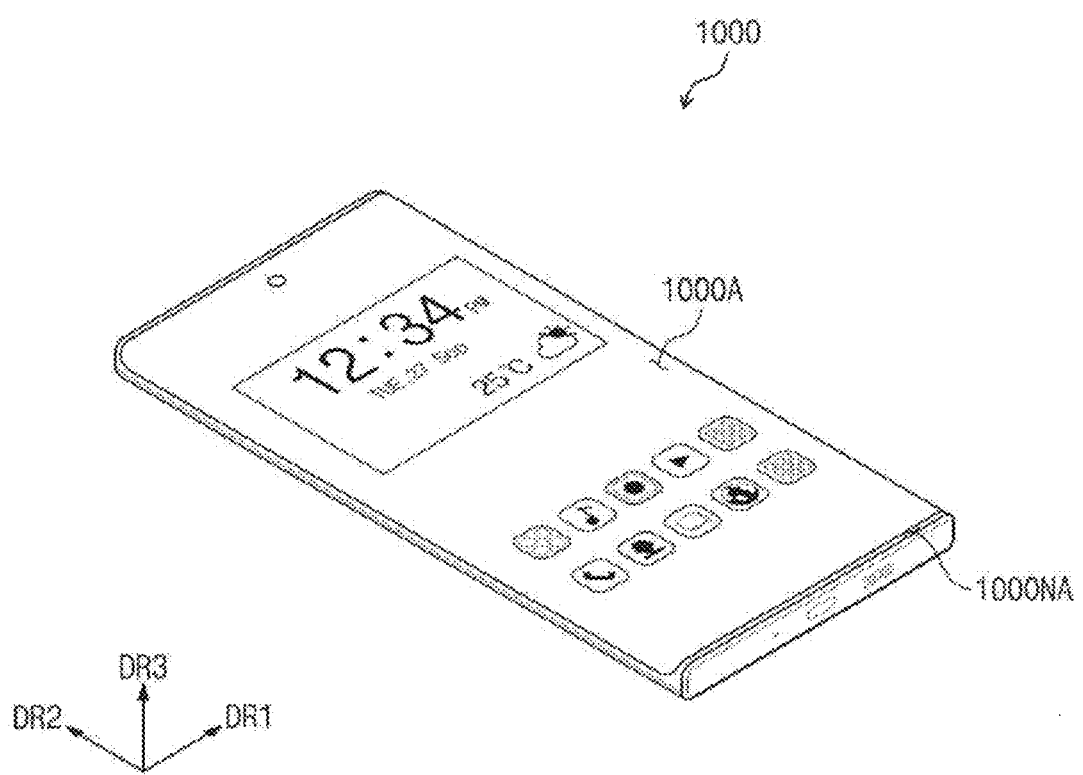
FIG. 1 illustrates an embodiment of an electronic device.

In this specification, when an element (or region, layer, part, etc.) is referred to as being "on", "connected to", or "coupled to" another element, it means that it may be directly placed on/connected to/coupled to other components, or a third component may be arranged between them. Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing. Unless otherwise defined, all terms (including technical and scientific terms) used herein have the same meaning as commonly understood by one of ordinary skill in the art to which this inventive concept belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, devices, modules, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

FIG. 1 is a perspective view of an electronic device 1000 according to an embodiment of the inventive concept. Referring to FIG. 1, the electronic device 1000 may be a device that is activated according to one or more electrical signals. Examples of the electronic device 1000 include, but are not limited to, a mobile phone, a foldable mobile phone, a notebook computer, a television, a tablet, a car navigation system, a game console, or a wearable device. FIG. 1 illustrates that the electronic device 1000 as a mobile phone as an example.

The electronic device 1000 may include an active area 1000A and a peripheral area 1000NA. The electronic device 1000 may display an image through the active area 1000A. The active area 1000A may include a surface which extends in a first direction DR1 and a second direction DR2. The peripheral area 1000NA may entirely or partially surround the active area 1000A. The thickness direction of the electronic device 1000 may extend in the third direction DR3 intersecting the first direction DR1 and the second direction DR2. Accordingly, the front (or upper) and rear (or lower) surfaces of the electronic device 1000 may be separated from one another in the third direction DR3.

Figure 2:
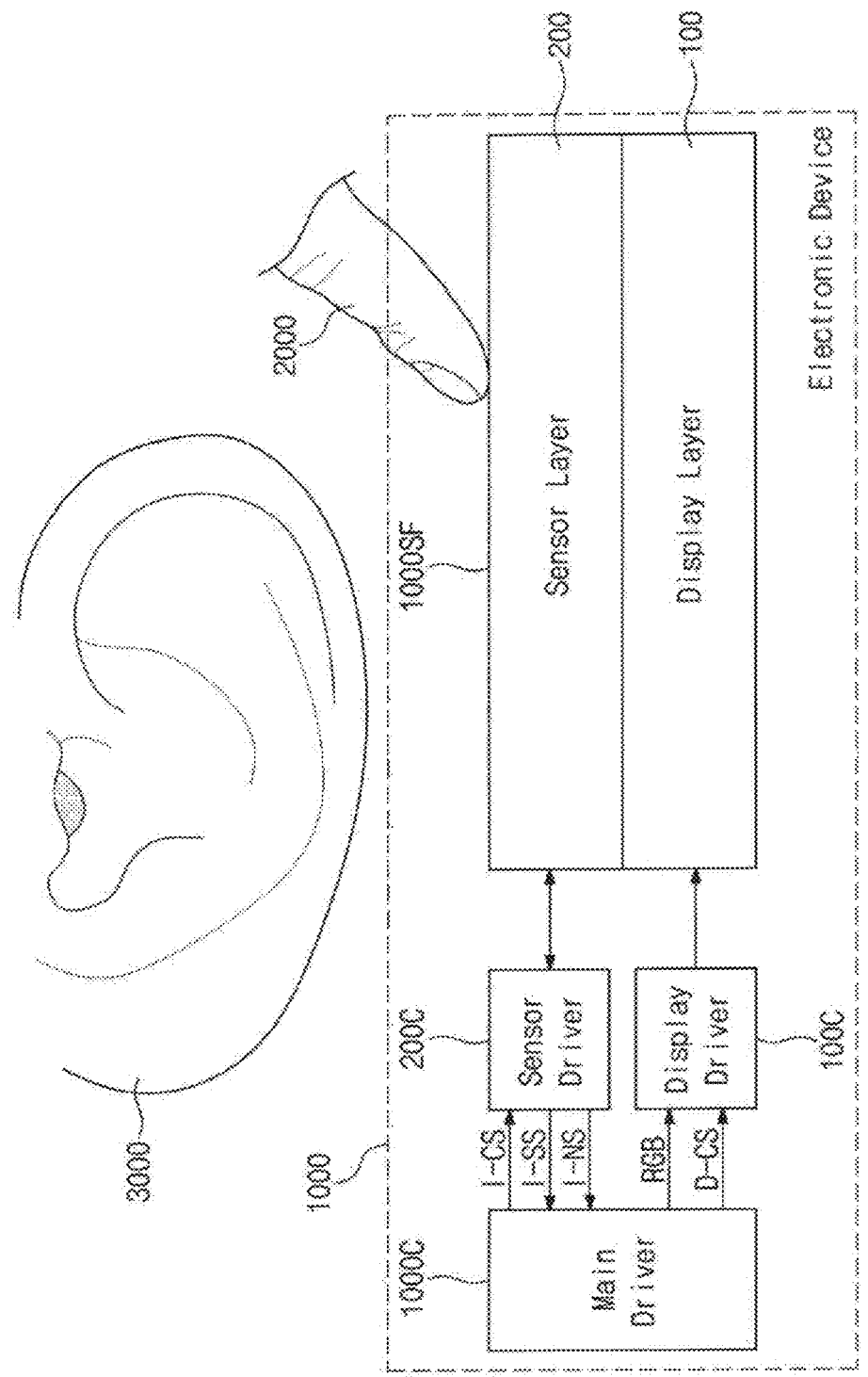
FIG. 2 illustrates an embodiment of operation of an electronic device.

FIG. 2 is a diagram illustrating an operation of the electronic device 1000 according to an embodiment of the inventive concept.

Referring to FIG. 2, the electronic device 1000 may include a display layer 100, a sensor layer 200, a display driver 100C, a sensor driver 200C, and a main driver 1000C. The display layer 100 may substantially generate an image and may include a light emitting display layer. The display layer 100 may be, for example, an organic light emitting display layer, a quantum dot display layer, a micro LED display layer, or a nano LED display layer.

The sensor layer 200 may be on the display layer 100 and may detect an externally applied input 2000 or 3000. The input 2000 or 3000 may include, for example, one that provides a change in capacitance or resistance. The sensor layer 200 may detect an input, for example, by not only a passive type of input (e.g., contact or near contact by a body part), but also an active type of input that provides a driving signal.

The main driver 1000C may control overall operation of the electronic device 1000. For example, the main driver 1000C may control operation of the display driver 100C and the sensor driver 200C. The main driver 1000C may include at least one microprocessor, and in some embodiments may be referred to as a host. The main driver 1000C may further include a graphic controller.

The display driver 100C may drive the display layer 100 and may receive image data RGB and a control signal D-CS from the main driver 1000C. The control signal D-CS may include various signals. For example, the control signal D-CS may include an input vertical synchronization signal, an input horizontal synchronization signal, a main clock, and a data enable signal. The display driver 100C may generate a vertical synchronization signal and a horizontal synchronization signal for controlling timing of signals to be provided to the display layer 100 based on the control signal D-CS.

The sensor driver 200C may drive the sensor layer 200 and may receive a control signal I-CS from the main driver 1000C. The control signal I-CS may include, for example, a mode determination signal and a clock signal for determining a driving mode of the sensor driver 200C.

The sensor driver 200C may calculate input coordinate information based on signals from the sensor layer 200 and may provide a coordinate signal I-SS having coordinate information to the main driver 1000C. The main driver 1000C executes operations corresponding to inputs based on the coordinate signal I-SS. For example, the main driver 1000C may operate the display driver 100C to display a new application image on the display layer 100.

The sensor driver 200C may detect the approach of object 3000 (spaced apart from the surface 1000SF of the electronic device 1000) based on a signal received from the sensor layer 200. This form of detection may occur even though there is no contact between object 3000 and surface 1000SF, e.g., while object 3000 is separated from surface 1000SF. In this case, the separated object 3000 may be referred to as a hovering object. In FIG. 2, the separated object 3000 is illustrates as the ear of a user who accesses the electronic device 1000, but object 3000 may be different body part in another embodiment. The sensor driver 200C may provide a proximity signal I-NS having proximity object detection information to the main driver 1000C. The main driver 1000C may operate the display driver 100C to reduce luminance of an image displayed on the display layer 100 or not to display an image on the display layer based on the proximity signal I-NS. In one embodiment, the main driver 1000C may turn off the display layer 100 based on the proximity signal I-NS.

Figure 3A:
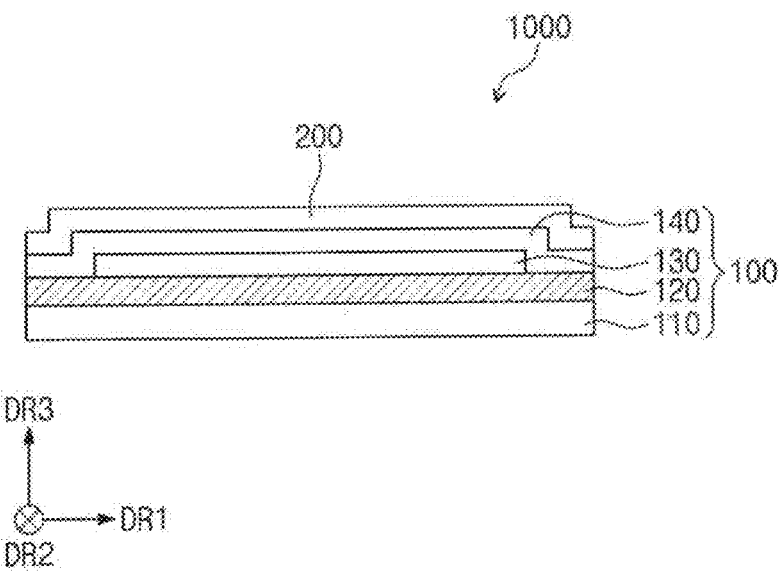
FIGS. 3A and 3B illustrate cross-sectional views of embodiments of an electronic device.

Referring to FIG. 3A, the display layer 100 may include a base layer 110, a circuit layer 120, a light emitting element layer 130, and an encapsulation layer 140. The base layer 110 may serve as a base surface on which the circuit layer 120 is disposed. The base layer 110 may be, for example, a glass substrate, a metal substrate, a polymer substrate, or a substrate including another material. In one embodiment, the base layer 110 may be an inorganic layer, an organic layer, or a composite material layer.

The base layer 110 may have a multilayer structure. For example, the base layer 110 may include a first synthetic resin layer, a silicon oxide (SiOx) layer on the first synthetic resin layer, an amorphous silicon (a-Si) layer on the silicon oxide layer, and a second synthetic resin layer on the amorphous silicon layer. The silicon oxide layer and the amorphous silicon layer may be referred to as a base barrier layer.

Each of the first and second synthetic resin layers may include, for example, a polyimide resin. In addition, each of the first and second synthetic resin layers may include at least one of acrylic resin, methacrylate resin, polyisoprene resin, vinyl resin, epoxy resin, urethane resin, cellulose resin, siloxane resin, polyamide resin, or perylene resin. In at least one embodiment, each of the first and second synthetic resin layers may be resins including a specific functional group and/or other materials.

The circuit layer 120 may be on the base substrate 110 and may include an insulating layer, a semiconductor pattern, a conductive pattern, and a signal wire. The insulating layer, a semiconductor layer, and a conductive layer may be formed on the base layer 110 by methods including, for example, coating and deposition. Thereafter, the insulating layer, the semiconductor layer, and the conductive layer may be selectively patterned through a plurality of photolithography processes. After that, a semiconductor pattern, a conductive pattern, and a signal line in the circuit layer 120 may be formed.

The light emitting element layer 130 may be on the circuit layer 120 and may include a light emitting element. For example, the light emitting element layer 130 may include an organic light emitting material, a quantum dot, a quantum rod, a micro LED, or a nano LED.

The encapsulation layer 140 may be on the light emitting element layer 130 to protect the light emitting element layer 130 from foreign substances such as moisture, oxygen, and dust particles.

The sensor layer 200 may be on the display layer 100 and may detect an externally applied input. The input may be, for example, a user input including but not limited to a body part, light, heat, pen, pressure, or another type of input. The sensor layer 200 may be formed on the display layer 100, for example, through a continuous process. In this case, the sensor layer 200 may be considered to be directly disposed on the display layer 100. In one embodiment, directly disposed may indicate that a third component is not between the sensor layer 200 and the display layer 100. For example, a separate adhesive member may not be disposed between the sensor layer 200 and the display layer 100.

In other embodiments, the sensor layer 200 may be indirectly disposed on display layer 100. For example, sensor layer 200 may be coupled to the display layer 100 through an adhesive material, e.g., pressure-sensitive adhesive or another type of adhesive.

In one embodiment, the electronic device 1000 may further include an antireflection layer and an optical layer on the sensor layer 200. The antireflection layer may reduce reflectance of external light incident from outside of the electronic device 1000. The optical layer may improve front luminance of the electronic device 1000 by controlling the direction of light incident from the display layer 100.

Figure 3B:
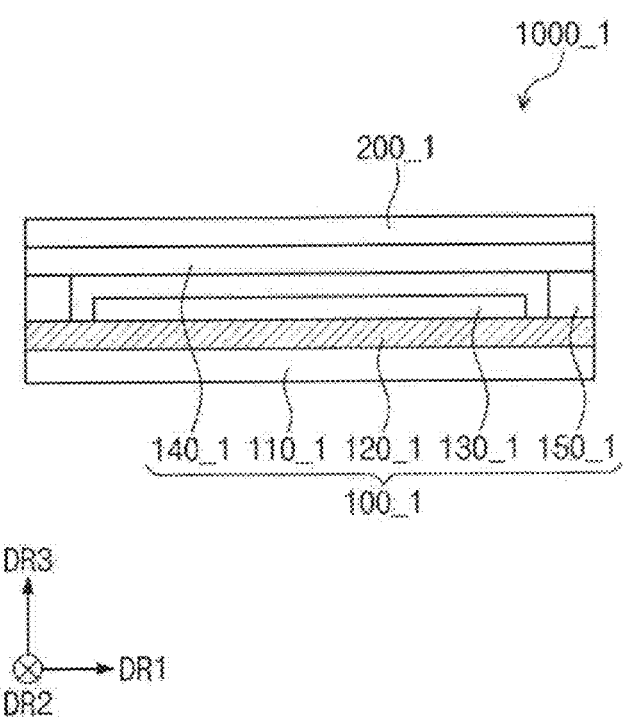

FIG. 3B illustrates an embodiment of a cross-sectional view of an electronic device 1000_1 according to an embodiment of the inventive concept.

Referring to FIG. 3B, the electronic device 1000_1 may include a display layer 100_1 and a sensor layer 200_1. The display layer 100_1 may include a base substrate 110_1, a circuit layer 120_1, a light emitting element layer 130_1, a sealing substrate 140_1, and a coupling member 150_1. Each of the base substrate 110_1 and the sealing substrate 140_1 may be a glass substrate, a metal substrate, a polymer substrate, or a substrate of another material.

The coupling member 150_1 may be between the base substrate 110_1 and the sealing substrate 140_1, and may couple the sealing substrate 140_1 to the base substrate 110_1 or the circuit layer 120_1. The coupling member 150_1 may include an inorganic material and/or an organic material. For example, the inorganic material may include a frit seal and the organic material may include a photocurable resin or a photoplastic resin. However, the material(s) of the coupling member 150_1 may be different in another embodiment.

The sensor layer 200_1 may be directly disposed on the sealing substrate 140_1, e.g., a third component is not between the sensor layer 200_1 and the sealing substrate 140_1. In this case, for example, a separate adhesive member may not be disposed between the sensor layer 200_1 and the display layer 100_1. However, the inventive concept is not limited thereto, and the sensor layer 200_1 may be indirectly disposed on the sealing substrate 140_1, e.g., an adhesive layer may be disposed between the sensor layer 200_1 and the sealing substrate 140_1.

Figure 4:
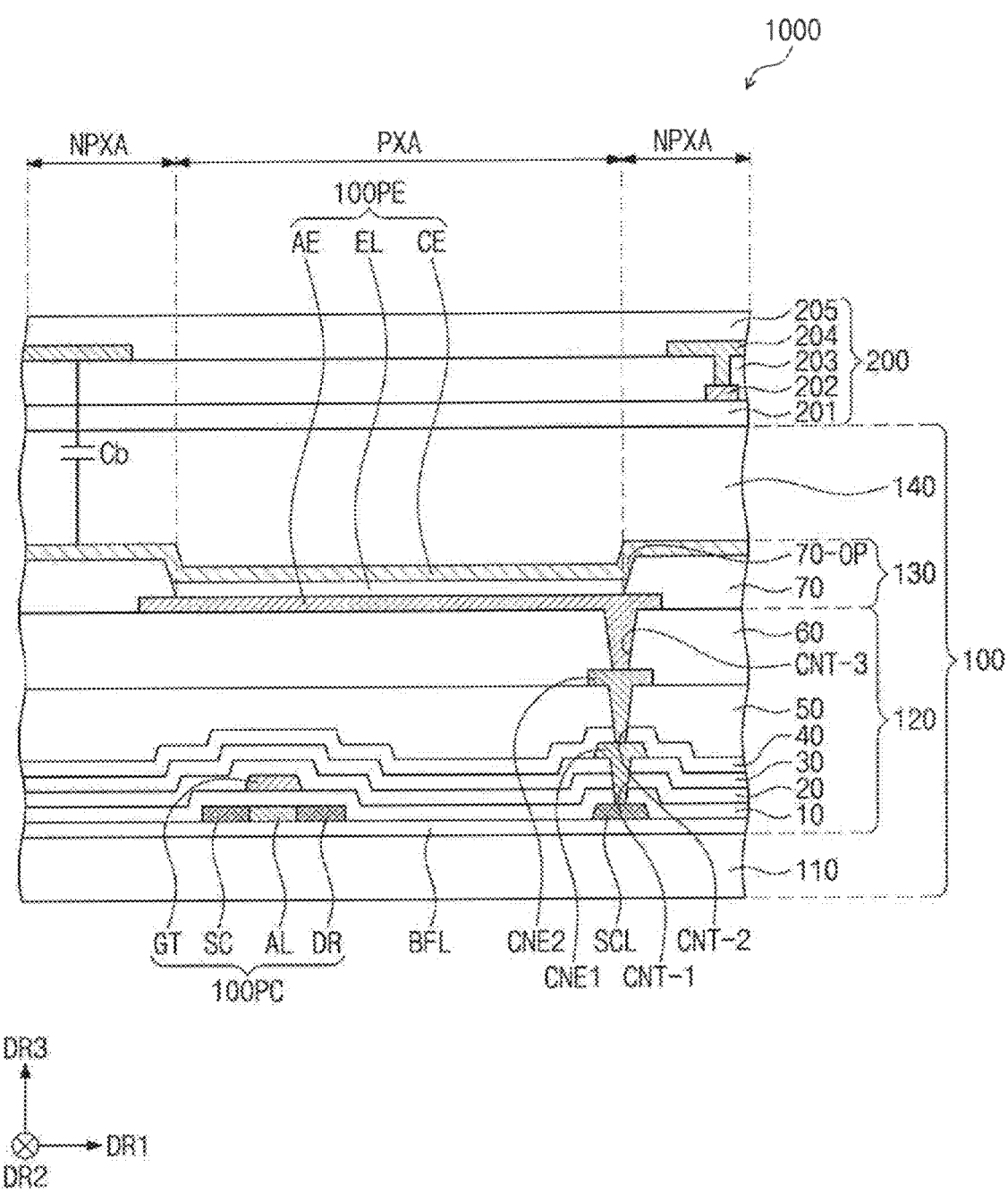
FIG. 4 illustrates a cross-sectional view of an embodiment of an electronic device.

FIG. 4 illustrates a cross-sectional view of an electronic device 1000 according to an embodiment of the inventive concept. Referring to FIG. 4, at least one inorganic layer is formed on the upper surface of the base layer 110. The inorganic layer may include, for example, at least one of aluminum oxide, titanium oxide, silicon oxide, silicon nitride, silicon oxynitride, zirconium oxide, or hafnium oxide. In one embodiment, the inorganic layer may be formed in multiple layers. For example, multi-layered inorganic layers may constitute a barrier layer and/or a buffer layer. In this embodiment, the display layer 100 is shown to include the buffer layer BFL.

The buffer layer BFL may improve bonding force between the base layer 110 and the semiconductor pattern. The buffer layer BFL may include at least one of silicon oxide, silicon nitride, or silicone oxynitride. For example, the buffer layer BFL may have a structure in which a silicon oxide layer and a silicon nitride layer are alternately stacked.

The semiconductor pattern may be on the buffer layer BFL and, for example, may include polysilicon. However, the inventive concept is not limited thereto. For example, the semiconductor pattern may include amorphous silicon, low-temperature polycrystalline silicon, an oxide semiconductor, or another material.

FIG. 4 illustrates an example of one or more semiconductor patterns, but one or more other semiconductor patterns may be disposed in other areas. The semiconductor pattern may be arranged in a specific rule across the pixels. Semiconductor patterns may have different electrical properties depending on whether or not they are doped. In one embodiment, the semiconductor pattern may include a first area having high conductivity and a second area having low conductivity. The first area may be doped with an N-type dopant or a P-type dopant. The P-type transistor may include a doping area doped with a P-type dopant, and the N-type transistor may include a doping area doped with an N-type dopant. The second area may be a non-doped area or an area doped with a lower concentration than the first area.

The conductivity of the first area may be greater than that of the second area and may substantially serve as an electrode or a signal wire. The second area may substantially correspond to the active (or channel) of the transistor. For example, part of the semiconductor pattern may be an active part of the transistor, another part may be a source or drain of the transistor, and another part may be a connection electrode or a connection signal wire.

In one embodiment, each pixel may have an equivalent circuit that includes seven transistors, one capacitor, and a light emitting element. The equivalent circuit diagram of the pixel may be modified in various ways. In FIG. 4, one transistor 100PC and a light emitting element 100PE in a pixel are illustrated as an example.

The source SC, the active AL, and the drain DR of the transistor 100PC may be formed from a semiconductor pattern. The source SC and the drain DR may extend in opposite directions from the active AL on a cross section. FIG. 4 illustrates part of a connection signal line SCL formed from a semiconductor pattern. The connection signal line SCL may be connected to the drain DR of the transistor 100PC on a plane.

The first insulating layer 10 may be on the buffer layer BFL and may overlap a plurality of pixels in common and cover a semiconductor pattern. The first insulating layer 10 may be an inorganic layer and/or an organic layer and may have a single layer or multilayer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. In addition to the first insulating layer 10, the insulating layer of the circuit layer 120 to be described later may be an inorganic layer and/or an organic layer, and may have a single layer or multilayer structure. The inorganic layer may include at least one of the above-mentioned materials, but is not limited thereto.

The gate GT of the transistor 100PC is on the first insulating layer 10 and may be part of the metal pattern. The gate GT overlaps the active AL. In the process of doping the semiconductor pattern, the gate GT may function as a mask.

The second insulating layer 20 is on the first insulating layer 10 and may cover the gate GT. The second insulating layer 20 may overlap the pixels in common, may be an inorganic layer and/or an organic layer, and may have a single layer or multilayer structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

The third insulating layer 30 may be on the second insulating layer 20 and may have a single layer or multilayer structure. For example, the third insulating layer 30 may have a multilayer structure including a silicon oxide layer and a silicon nitride layer.

The first connection electrode CNE1 may be on the third insulating layer 30 and may be connected to the connection signal line SCL through a contact hole CNT-1 penetrating the first, second, and third insulating layers 10, 20, and 30.

The fourth insulating layer 40 may be on the third insulating layer 30 and, for example, may be a single layer of silicon oxide. The fifth insulating layer 50 may be on the fourth insulating layer 40 and, for example, may be an organic layer.

The second connection electrode CNE2 may be on the fifth insulating layer 50 and may be connected to the first connection electrode CNE1 through a contact hole CNT-2 penetrating the fourth insulating layer 40 and the fifth insulating layer 50.

The sixth insulating layer 60 is on the fifth insulating layer 50 and may cover the second connection electrode CNE2. The sixth insulating layer 60 may be an organic layer.

The light emitting element layer 130 may be on the circuit layer 120 and may include a light emitting element 100PE. For example, the light emitting element layer 130 may include, for example, an organic light emitting material, a quantum dot, a quantum rod, a micro LED, or a nano LED. Hereinafter, a description will be given that the light emitting element 100PE is an organic light emitting element as an example.

The light emitting element 100PE may include a first electrode AE, a light emitting layer EL, and a second electrode CE. The first electrode AE may be on the sixth insulating layer 60 and may be connected to the second connection electrode CNE2 through a contact hole CNT-3 penetrating through the sixth insulating layer 60.

The pixel defining film 70 is on the sixth insulating layer 60 and may cover a portion of the first electrode AE. An opening part 70-OP is included in the pixel defining film 70 to expose at least a portion of the first electrode AE.

The active area 1000A (e.g., refer to FIG. 1) may include an emission area PXA and a non-emission area NPXA adjacent to the emission area PXA. The non-emission area NPXA may entirely or partially surround the emission area PXA. In this embodiment, the emission area PXA corresponds to a partial area of the first electrode AE exposed by the opening part 70-OP.

The light emitting layer EL may be on the first electrode AE and may be disposed in an area corresponding to the opening part 70-OP. For example, the light emitting layer EL may be formed separately on each of the pixels. When the light emitting layer EL is formed separately on each of the pixels, each of the light emitting layers EL may emit light of at least one color, e.g., blue, red, and green. However, the inventive concept is not limited thereto. In one embodiment, the light emitting layer EL may be provided in the pixels in common. In this case, the light emitting layer EL may provide, for example, blue light or white light.

The second electrode CE may be on the light emitting layer EL, may have an integral shape and may be commonly disposed in a plurality of pixels.

A hole control layer may be between the first electrode AE and the light emitting layer EL, and may be commonly disposed in the emission area PXA and the non-emission area NPXA. The hole control layer may include a hole transport layer and may further include a hole injection layer. An electron control layer may be between the light emitting layer EL and the second electrode CE. The electron control layer may include an electron transport layer and may further include an electron injection layer. The hole control layer and the electron control layer may be commonly formed in a plurality of pixels, for example, using an open mask.

The encapsulation layer 140 may be on the light emitting element layer 130 and may include an inorganic layer, an organic layer, and an inorganic layer sequentially stacked. The encapsulation layer 140 may have one or more different layers or a different number of layers in other embodiments.

The inorganic layer may protect the light emitting element layer 130 from moisture and oxygen, and the organic layer may protect the light emitting element layer 130 from foreign substances such as dust particles. The inorganic layers may include, for example, a silicon nitride layer, a silicon oxynitride layer, a silicon oxide layer, a titanium oxide layer, or an aluminum oxide layer. The organic layer may include, for example, an acryl organic layer, but is not limited thereto.

The sensor layer 200 may include a base layer 201, a first conductive layer 202, a detection insulating layer 203, a second conductive layer 204, and a cover insulating layer 205. The base layer 201 may be an inorganic layer including, for example, at least one of silicon nitride, silicon oxynitride, or silicon oxide. In one embodiment, the base layer 201 may be an organic layer including, for example, an epoxy resin, an acrylic resin, or an imide resin. The base layer 201 may have a single layer structure or may have a multilayer structure stacked in the third direction DR3.

Each of the first conductive layer 202 and the second conductive layer 204 may have a single layer structure or may have a multilayer structure stacked along the third direction DR3. The single-layered conductive layer may include a metal layer or a transparent conductive layer. The metal layer may include, for example, molybdenum, silver, titanium, copper, aluminum, or an alloy thereof. The transparent conductive layer may include a transparent conductive oxide. Examples include indium tin oxide (ITO), indium zinc oxide (IZO), zinc oxide (ZnO), and indium zinc tin oxide (IZTO). In addition, the transparent conductive material may include a conductive polymer, such as PEDOT, metal nanowires, graphene, or another material.

The multilayered conductive layer may include metal layers, e.g., the metal layers may have a three-layer structure of titanium/aluminum/titanium. In one embodiment, the multilayered conductive layer may include at least one metal layer and at least one transparent conductive layer.

At least one of the detection insulating layer 203 or the cover insulating layer 205 may include an inorganic film. The inorganic film may include, for example, at least one of aluminum oxide, titanium oxide, silicon oxide, silicon nitride, silicon oxynitride, zirconium oxide, or hafnium oxide.

At least one of the detection insulating layer 203 or the cover insulating layer 205 may include an organic film. The organic film may include, for example, at least one of acrylic resin, methacrylic resin, polyisoprene resin, vinyl resin, epoxy resin, urethane resin, cellulose resin, siloxane resin, polyimide resin, polyamide resin, or perylene resin.

A parasitic capacitance Cb may be generated between the sensor layer 200 and the second electrode CE. The parasitic capacitance Cb may also be referred to as a base capacitance. As the distance between the sensor layer 200 and the second electrode CE is closer, the parasitic capacitance Cb value may increase. As the parasitic capacitance Cb increases, the ratio of the change amount of the capacitance to the reference value may decrease. A change in capacitance may refer to a change in capacitance that occurs between before and after input by, for example, an object 3000 (e.g., see FIG. 3).

The sensor driver 200C (e.g., FIG. 2) that processes the detected signal from the sensor layer 200 may perform a leveling operation of removing a value corresponding to the parasitic capacitance Cb from the detected signal. Based on the leveling operation, the ratio of the change amount of the capacitance to the reference value is increased, which, in turn, may improve sensing sensitivity.

Figure 5A:
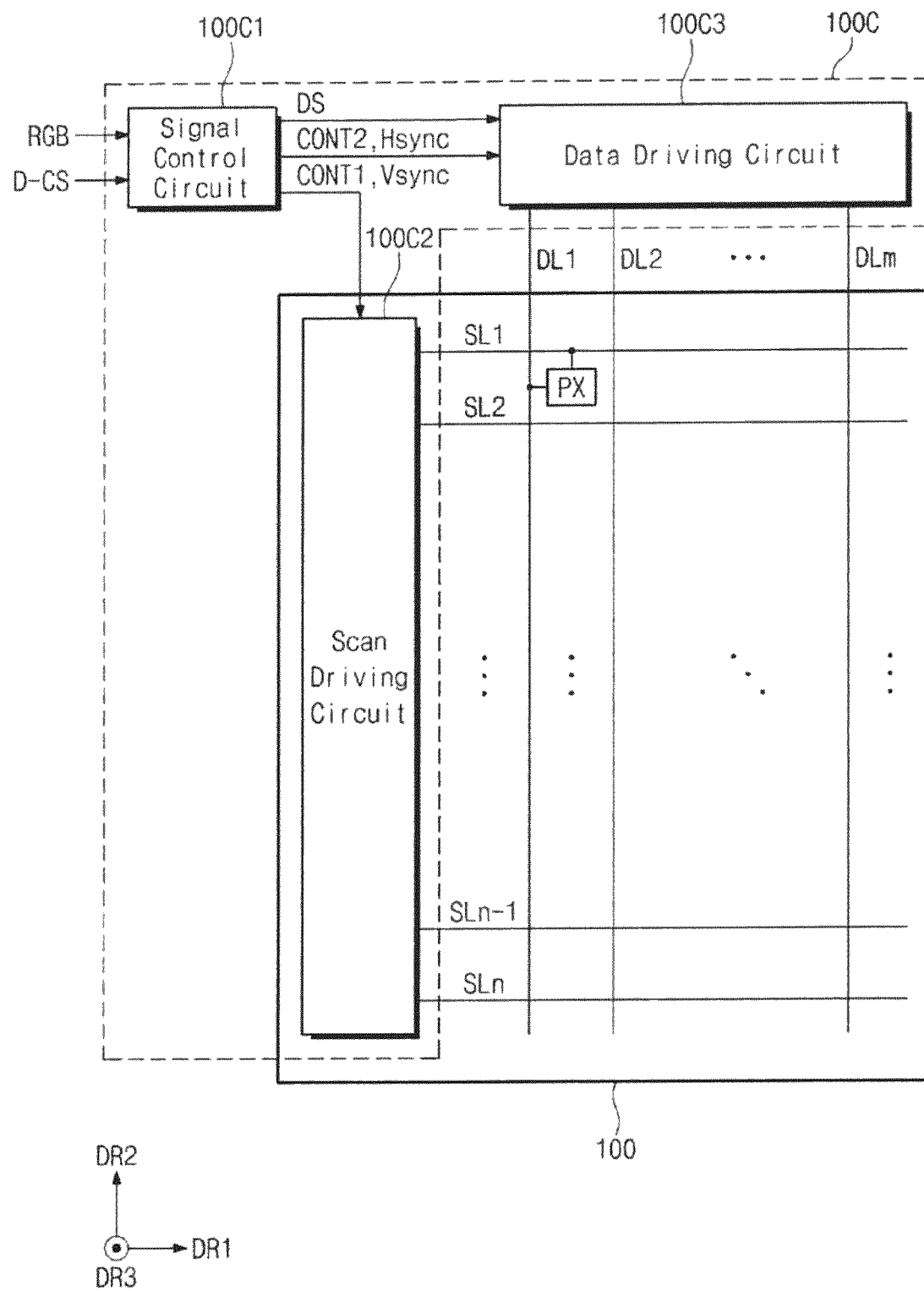
FIGS. 5A and 5B illustrate embodiments which include a display layer and a display driver.

FIG. 5A is a block diagram of display layer 100 and the display driver 100C according to an embodiment of the inventive concept.

Referring to FIG. 5A, the display layer 100 may include a plurality of scan lines SL1 to SLn, a plurality of data lines DL1 to DLm, and a plurality of pixels PX. Each of the pixels PX is connected to a corresponding data line among the data lines DL1 to DLm, and is connected to a corresponding scan line among the scan lines SL1 to SLn. In an embodiment of the inventive concept, the display layer 100 may further include emission control lines, and the display driver 100C may further include an emission driving circuit that provides control signals to emission control lines. The configuration of the display layer 100 is not particularly limited.

Each of the scan lines SL1 to SLn may extend along the first direction DR1, and the scan lines SL1 to SLn may be arranged to be spaced apart from each other in the second direction DR2. Each of the data lines DL1 to DLm may extend along the second direction DR2, and each of the data lines DL1 to DLm may be arranged to be spaced apart in the first direction DR1.

The display driver 100C may include a signal control circuit 100C1, a scan driving circuit 100C2, and a data driving circuit 100C3. The signal control circuit 100C1 may receive image data RGB and a control signal D-CS from the main driver 1000C (e.g., see FIG. 2). The control signal D-CS may include various signals. For example, the control signal D-CS may include an input vertical synchronization signal, an input horizontal synchronization signal, a main clock, and a data enable signal.

The signal control circuit 100C1 may generate a first control signal CONT1 and a vertical synchronization signal Vsync based on the control signal D-CS, and may output the first control signal CONT1 and the vertical synchronization signal Vsync to the scan driving circuit 100C2. The vertical synchronization signal Vsync may be included in the first control signal CONT1.

The signal control circuit 100C1 may generate a second control signal CONT2 and a horizontal synchronization signal Hsync based on the control signal D-CS, and output the second control signal CONT2 and the horizontal synchronization signal Hsync to the data driving circuit 100C3. The horizontal synchronization signal Hsync may be included in the second control signal CONT2.

Also, the signal control circuit 100C1 may output a driving signal DS obtained by processing the image data RGB according to the operating condition of the display layer 100 to the data driving circuit 100C3. The first control signal CONT1 and the second control signal CONT2 are signals may be used for operation of the scan driving circuit 100C2 and the data driving circuit 100C3.

The scan driving circuit 100C2 drives the plurality of scan lines SL1 to SLn in response to the first control signal CONT1 and the vertical synchronization signal Vsync. In an embodiment of the inventive concept, the scan driving circuit 100C2 may be formed, for example, by the same process as the circuit layer 120 (e.g., refer to FIG. 4) in the display layer 100, but may be formed by a different process in another embodiment. In one embodiment, the scan driving circuit 100C2 may be implemented as an integrated circuit (IC) directly mounted on a predetermined area of the display layer 100 or mounted on a separate printed circuit board in a chip-on-film (COF) method to be electrically connected to the display layer 100.

The data driving circuit 100C3 may output a grayscale voltage through a plurality of data lines DL1 to DLm in response to the second control signal CONT2, the horizontal synchronization signal Hsync, and the driving signal DS from the signal control circuit 100C1. The data driving circuit 100C3 may be implemented, for example, as an IC directly mounted on a predetermined area of the display layer 100 or mounted on a separate printed circuit board in a COF method to be electrically connected to the display layer 100. Different mounting locations and techniques may be used in other embodiments. For example, the data driving circuit 100C3 may be formed by the same process as the circuit layer 120 (e.g., refer to FIG. 4) in the display layer 100.

Figure 5B:
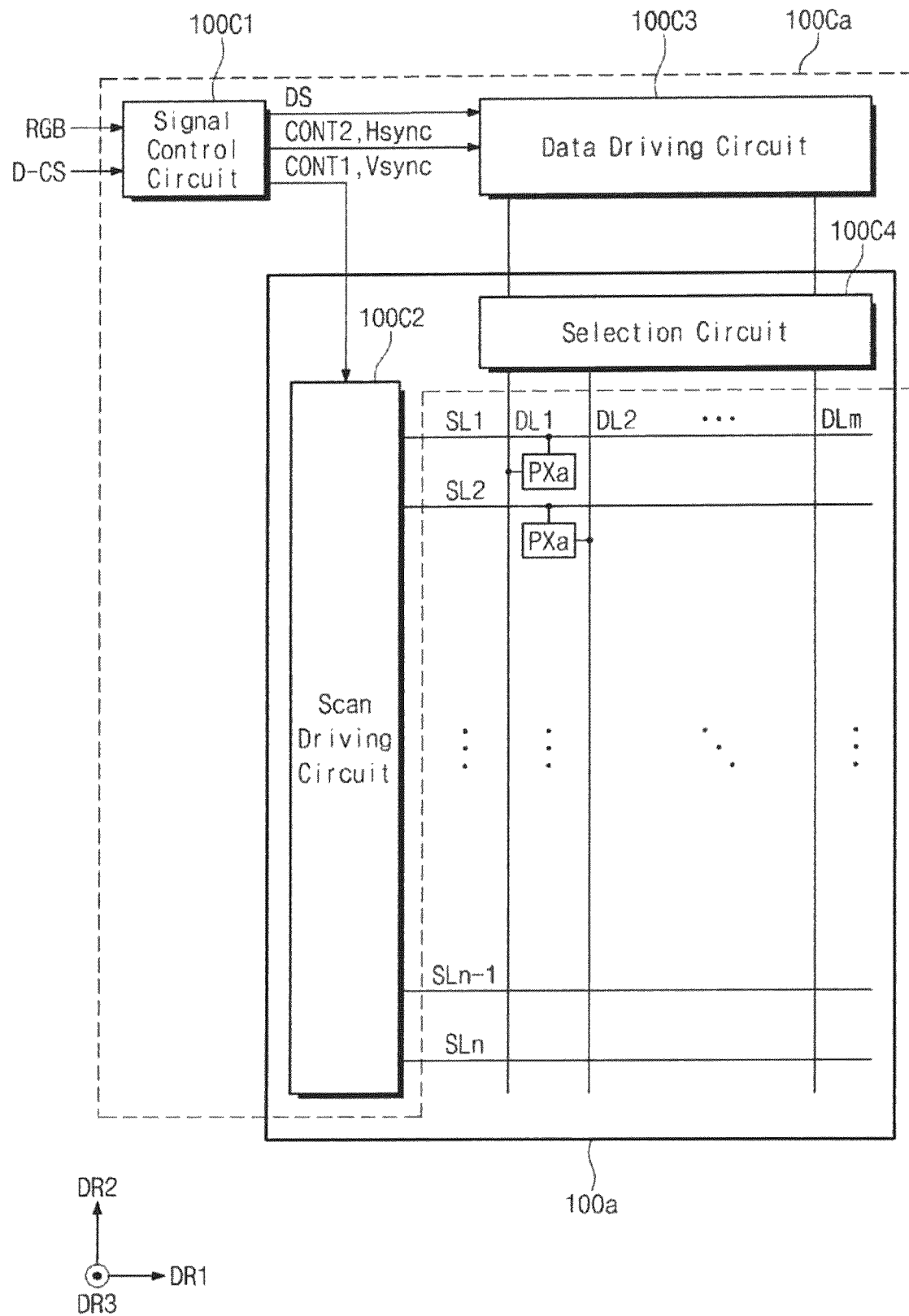

FIG. 5B is a block diagram of a display layer 100a and a display driver 100Ca according to an embodiment of the inventive concept. In the description of FIG. 5B, portions different from those of FIG. 5A will be described, and the same reference numerals are used for the same components.

Referring to FIG. 5B, the display layer 100a may include a plurality of scan lines SL1 to SLn, a plurality of data lines DL1 to DLm, and a plurality of pixels PXa. The plurality of pixels PXa may be arranged in a first direction DR1 and a second direction DR2. Some of the pixels PXa arranged in the same column (e.g., ones arranged in the second direction DR2) may be connected to the first data line DL1. Others may be connected to the second data line DL2.

The display driver 100Ca may include a signal control circuit 100C1, a scan driving circuit 100C2, a data driving circuit 100C3, and a selection circuit 100C4. The selection circuit 100C4 may electrically connect some of the data lines DL1 to DLm to the data driving circuit 100C3. For example, the selection circuit 100C4 may include a demultiplexer for selecting the data lines to be connected to the data driving circuit 100C3 among the data lines DL1 to DLm.

Figure 6:
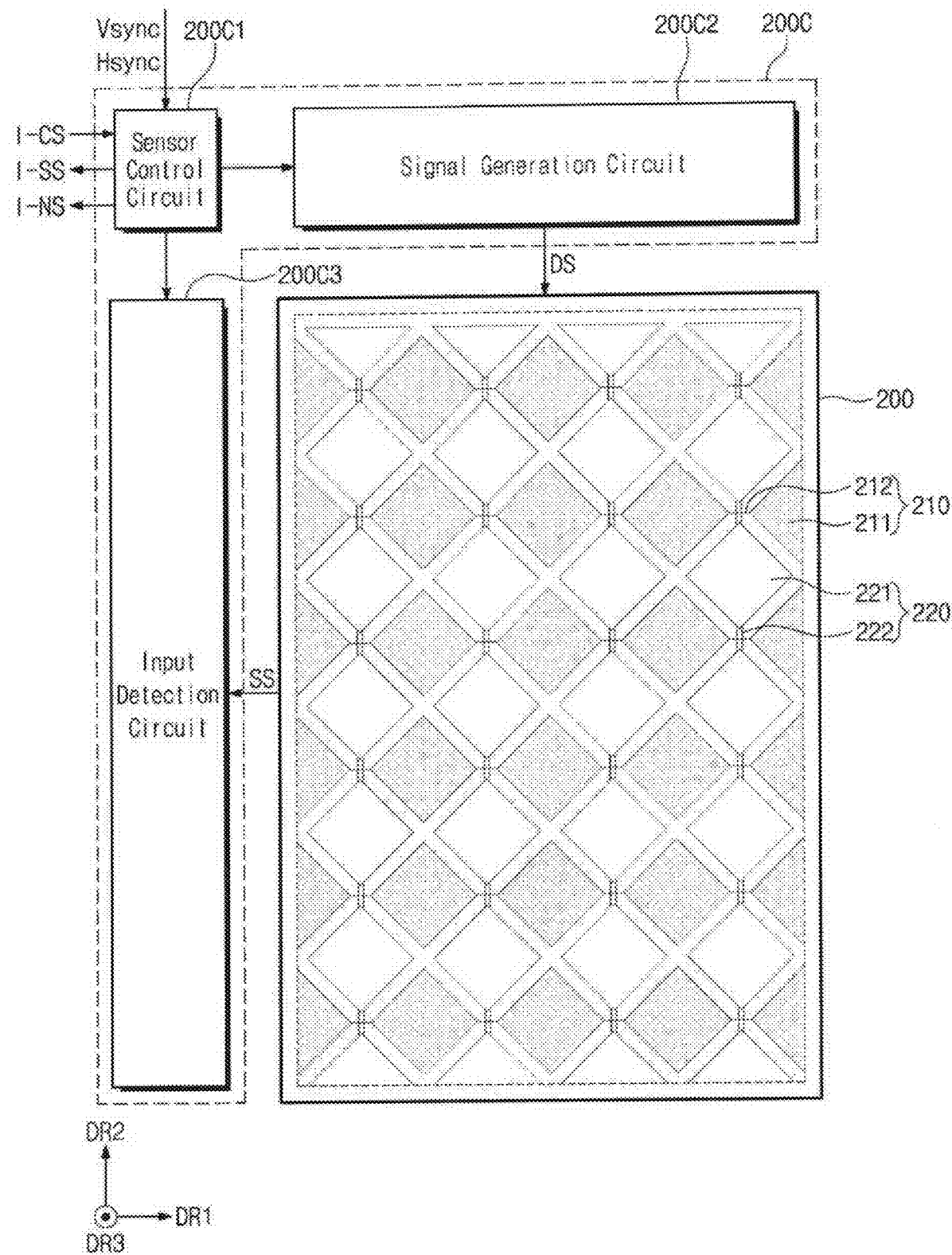
FIG. 6 illustrates an embodiment which includes a sensor layer and a sensor driver.

FIG. 6 is a block diagram of a sensor layer 200 and a sensor driver 200C according to an embodiment of the inventive concept.

Referring to FIG. 6, the sensor layer 200 may include a plurality of electrodes 210 and a plurality of cross electrodes 220. The cross electrodes 220 may cross the electrodes 210. The sensor layer 200 may further include a plurality of signal lines connected to the electrodes 210 and the cross electrodes 220.

Each of the electrodes 210 may include a first part 211 and a second part 212. The first part 211 and the second part 212 have an integral shape with each other and may be on the same layer. For example, the first part 211 and the second part 212 may be in the second conductive layer 204 (e.g., refer to FIG. 4).

Each of the cross electrodes 220 may include a detection pattern 221 and a bridge pattern 222. The two detection patterns 221 adjacent to each other may be electrically connected to each other by the two bridge patterns 222, but may be connected in a different manner in another embodiment. The two bridge patterns 222 may insulatively cross the second part 212. The detection pattern 221 may be in the second conductive layer 204 (e.g., see FIG. 4), and the bridge pattern 222 may be in the first conductive layer 202 (e.g., see FIG. 4).

The sensor driver 200C may receive a control signal I-CS from the main driver 1000C (e.g., see FIG. 2) and may provide a coordinate signal I-SS or a proximity signal I-NS to the main driver 1000C (e.g., see FIG. 2). The sensor driver 200C may be implemented as an integrated circuit (IC) directly mounted on a predetermined area of the sensor layer 200 or may be mounted on a separate printed circuit board in a chip-on-film (COF) method and electrically connected to the sensor layer 200.

The sensor driver 200C may include a sensor control circuit 200C1, a signal generation circuit 200C2, and an input detection circuit 200C3. The sensor control circuit 200C1 may receive a vertical synchronization signal Vsync and a horizontal synchronization signal Hsync from the display driver 100C. The sensor control circuit 200C1 may control the operation of the signal generation circuit 200C2 and the input detection circuit 200C3 based on the control signal I-CS, the vertical synchronization signal Vsync, and the horizontal synchronization signal Hsync.

The signal generation circuit 200C2 may output the driving signal DS to the sensor layer 200, for example, the electrodes 210. The input detection circuit 200C3 may receive the detection signal SS from the sensor layer 200. The input detection circuit 200C3 may convert an analog signal to a digital signal. For example, the input detection circuit 200C3 amplifies and filters the received analog signal. In one embodiment, the input detection circuit 200C3 may convert the filtered signal to a digital signal.

Figure 7:
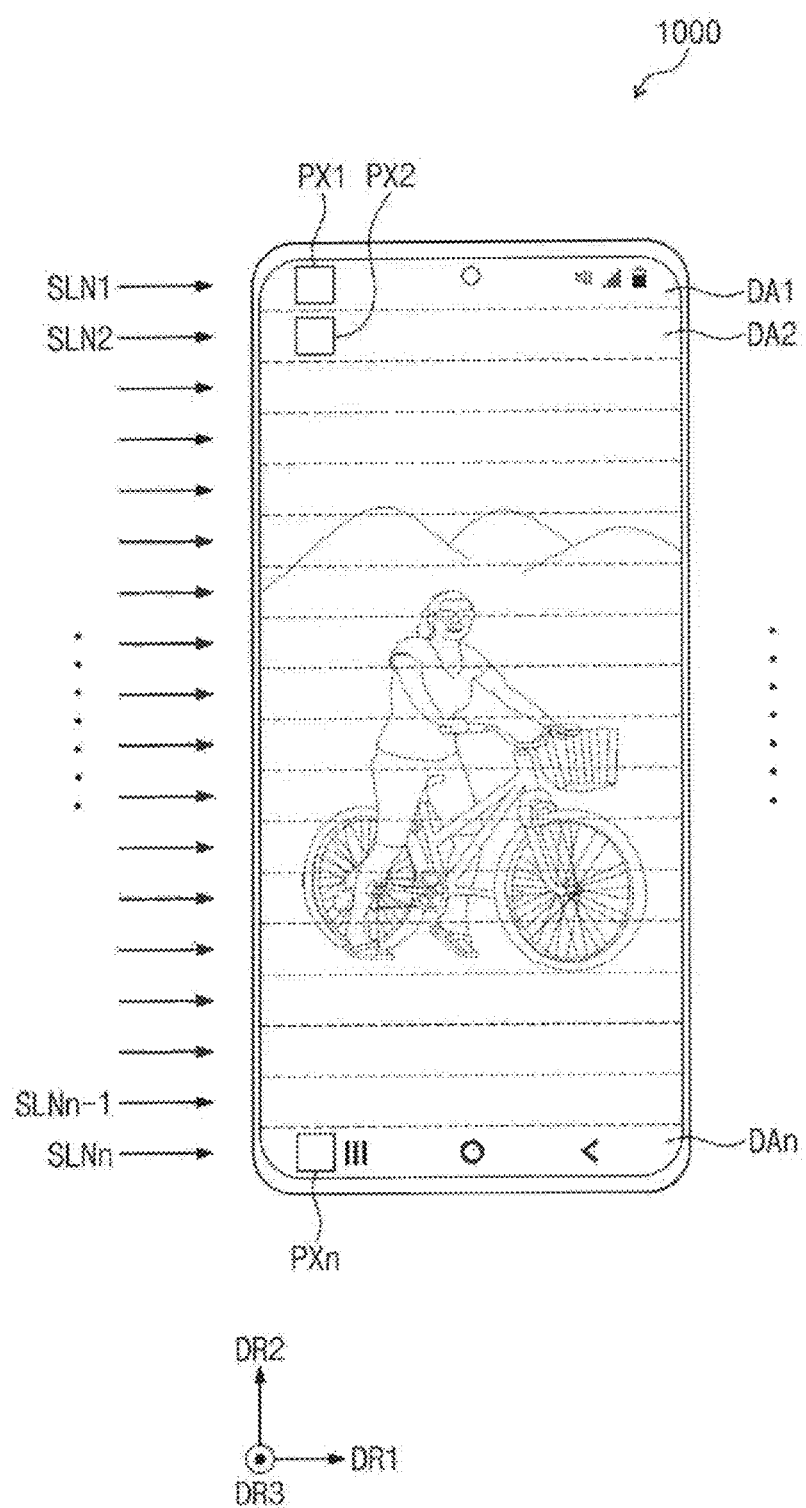
FIG. 7 illustrates an embodiment of an electronic device in a first display mode.

FIG. 7 is a diagram illustrating an embodiment of electronic device 1000 being driven in a first display mode.

Referring to FIGS. 5A and 7, display areas DA1 to DAn correspond to respective ones of the scan lines SL1 to SLn, e.g., in one-to-one correspondence. The display areas DA1 to DAn may include pixels PX1 to PXn, respectively. For example, the first display area DA1 may include first row pixels PX1 arranged along the first direction DR1 and connected to the first scan line SL1.

In the first display mode, the scan signals SLN1 to SLNn may be provided to the scan lines SL1 to SLn during one frame. For example, in the first display mode, the display layer 100 may operate at a first frame frequency (first frame rate) and a first frame frequency may be 120 hertz (Hz). In one embodiment, the scan signals SLN1 to SLNn may correspond to gate-on signals, and pixels connected to a scan line SL1 to SLn supplied with the scan signals SLN1 to SLNn may be charged with a voltage corresponding to the grayscale voltage.

When driving in the first display mode, the scan signals SLN1 to SLNn may be provided to the scan lines SL1 to SLn during one frame section. Accordingly, the pixels PX1 to PXn may be charged with a voltage corresponding to the grayscale voltage supplied through the data lines DL1 to DLm.

Figure 8:
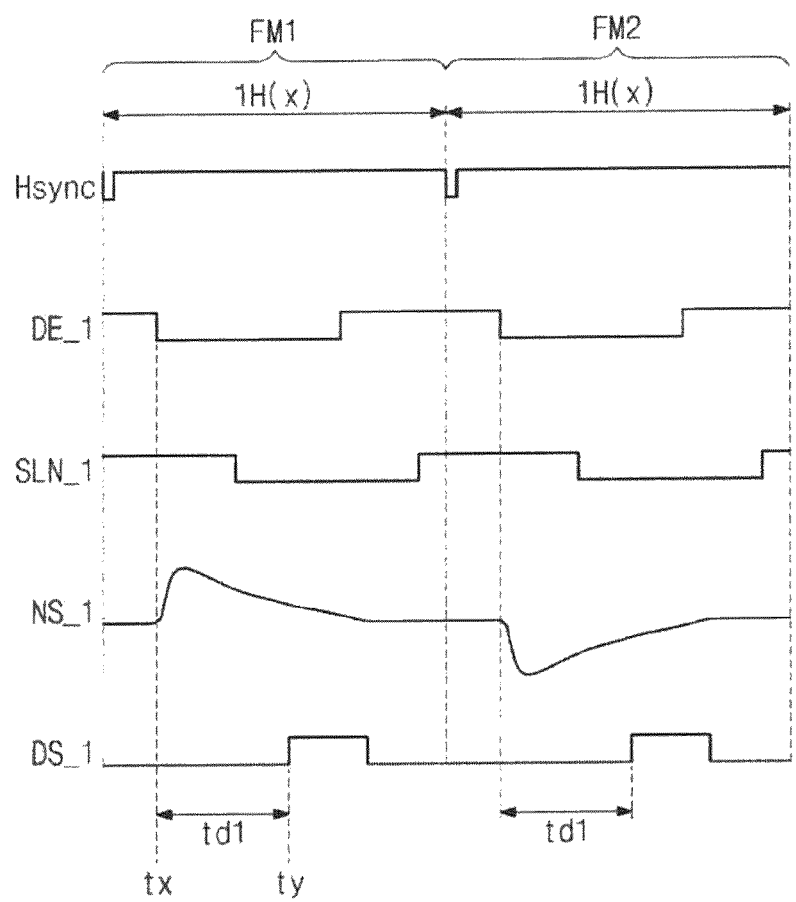
FIG. 8 illustrates an embodiment of a waveform diagram including signals of an electronic device.

FIG. 8 is an embodiment of a waveform diagram showing a horizontal synchronization signal, an output control signal, a scan signal, a noise signal, and a driving signal.

Referring to FIGS. 6, 7 and 8, when the electronic device 1000 is driven in the first display mode, the sensor driver 200C may be operated in the first sensing mode. The waveforms of FIG. 8 include, by way of example, a horizontal synchronization signal Hsync, an output control signal DE_1, a scan signal SLN_1, a noise signal NS_1, and a driving signal DS_1 to describe the first sensing mode of the sensor driver 200C.

In FIG. 8, signals are output in one horizontal period 1H(x) at substantially the same time point in one frame section FM1 (e.g., a first frame section) and the next one frame section FM2 (e.g., a second frame section). For example, FIG. 8 illustrates signals output in the x-th horizontal period 1H(x) of each of the first frame section FM1 and the second frame section FM2.

In one embodiment, the first horizontal period 1H(x) in the first frame section FM1 and the first horizontal period 1H(x) in the second frame section FM2 may be substantially the same. For example, the first horizontal period 1H(x) may be 6.5 microseconds (μs), and the first horizontal period 1H(x) may be changed according to the resolution of the electronic device 1000. These values may be different in another embodiment.

The output control signal DE_1 may control output of the grayscale voltage. For example, the data line may be electrically connected to the data driving circuit 100C3 by the output control signal DE_1. Thereafter, the data driving circuit 100C3 may output a grayscale voltage through a data line. For example, when the output control signal DE_1 is at a low level, the data driving circuit 100C3 may output the grayscale voltage to the data lines DL1 to DLm of the display layer 100. These values may correspond, for example, to the embodiment of FIG. 5A. The level change time point tx of the output control signal DE_1 may be before the level of the scan signal SLN_1 changes. The output control signal may be referred to as a line selection signal or a switch control signal.

A grayscale voltage corresponding to the image may be output to a data line in the first frame section FM1, and a grayscale voltage corresponding to the image may be output to a data line in the second frame section FM2. Thereafter, when the scan signal SLN_1 of the first frame section FM1 is at a first (e.g., low) level, a grayscale voltage may be provided to the pixel and the pixel may be charged with a voltage corresponding to the grayscale voltage. In addition, when the level of the scan signal SLN_1 of the second frame section FM2 is a low level, a grayscale voltage may be provided to the pixel and the pixel may be charged with a voltage corresponding to the grayscale voltage. The pixel may include transistors and a capacitor, and the capacitor may be charged with a voltage corresponding to the grayscale voltage.

The noise signal NS_1 may correspond to the potential of the second electrode CE (e.g., refer to FIG. 4). The level of the noise signal NS_1 may be greatly changed when the level of the output control signal DE_1 changes. For example, when the grayscale voltage starts to be output to the data lines DL1 to DLm (e.g., see FIG. 5A), the potential of the second electrode CE (e.g., see FIG. 4) may fluctuate.

The noise signal NS_1 may change according to an image displayed on the display layer 100 and may not have a specific regularity. Accordingly, the sensor driver 200C may be driven to sense an external input in a section that is affected (e.g., minimally or below a predetermined level) by the noise signal NS_1.

For example, the timing at which the sensor driver 200C outputs the driving signal DS_1 to the sensor layer 200 may be determined based on the timing at which the grayscale voltage is output. For example, the driving signal DS_1 may be output at a time point ty after the first time td1 based on the level change time point tx of the output control signal DE_1. The first time td1 may be a time sufficient to avoid a section with the largest noise by the display layer 100.

When the display driver 100C is driven in the first display mode, the sensor driver 200C may be driven in the first sensing mode (e.g., see FIG. 2). In the first display mode, scan lines SL1 to SLn of the display layer 100 are scanned. The second sensing mode may be a mode having a timing of sensing an external input in a section with smaller noise (e.g., below a predetermined level) by the display layer 100. Accordingly, non-uniformity in sensing sensitivity due to noise generated by the display layer 100 may be reduced.

Figure 9A:
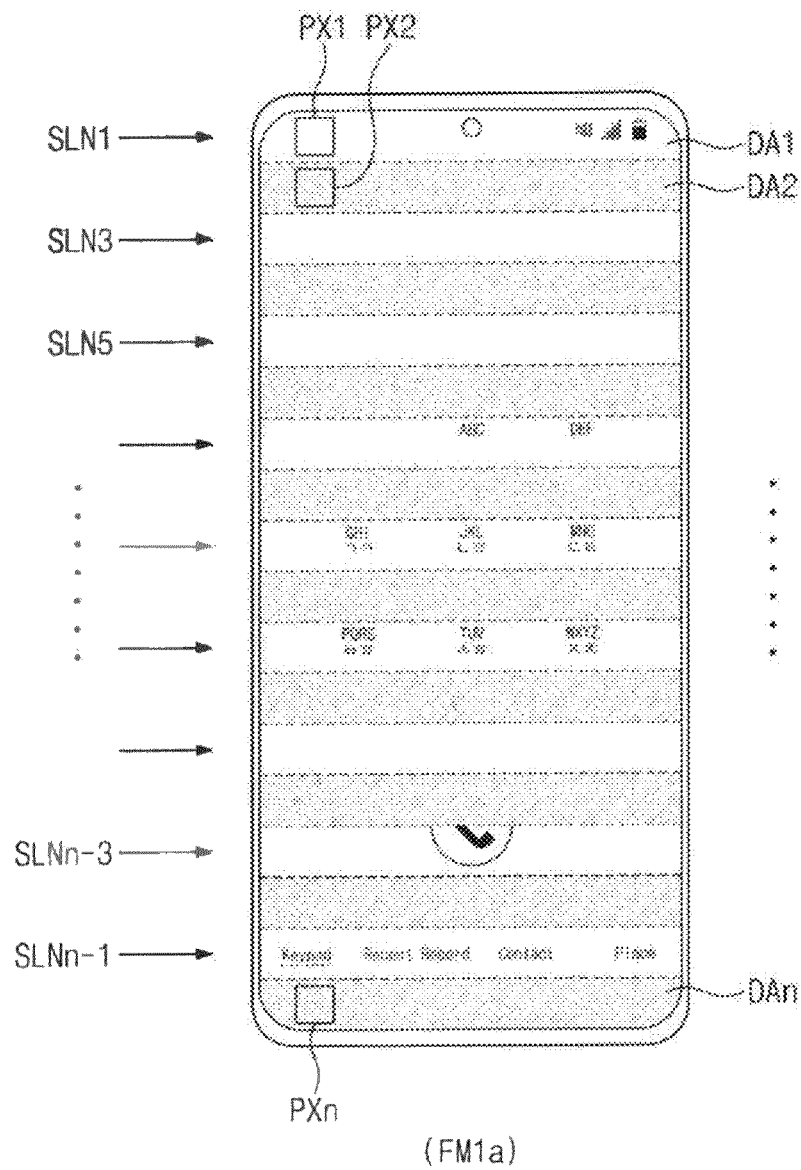
FIGS. 9A and 9B illustrates embodiments of an electronic device in a second display mode.
Figure 9B:
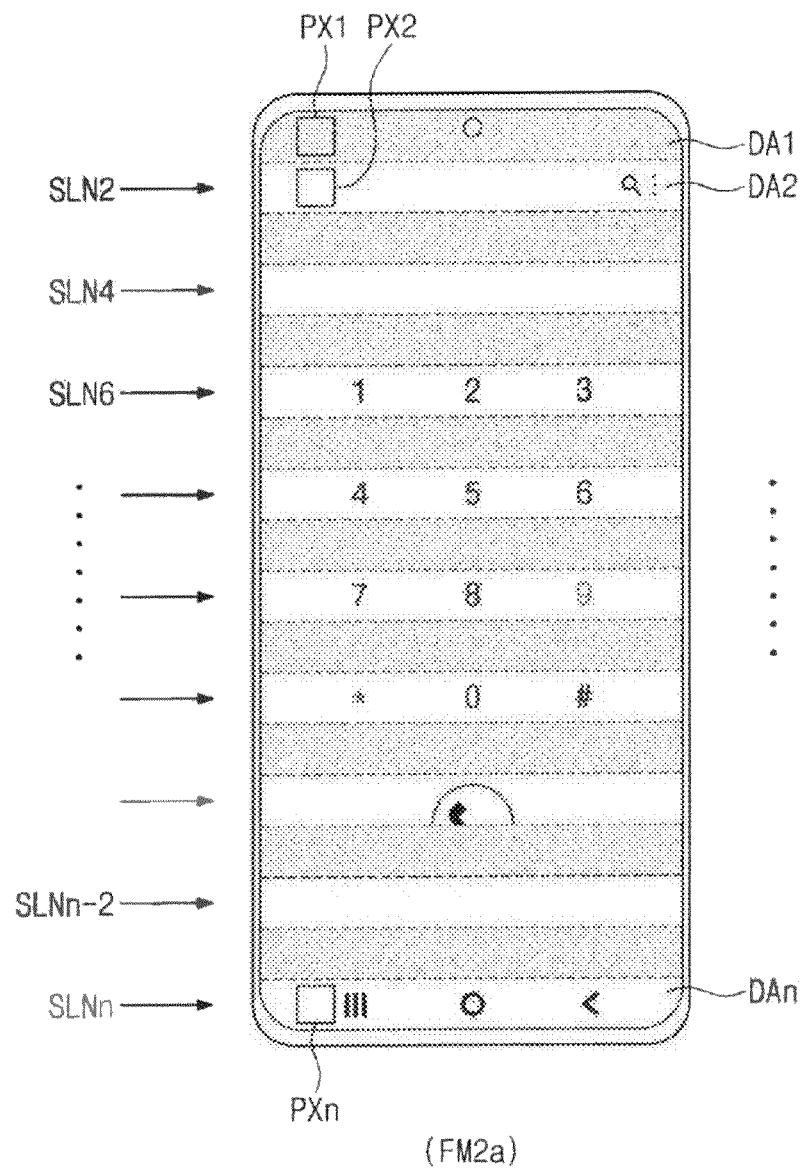

FIGS. 9A and 9B are diagrams illustrating embodiments of an electronic device being driven in a second display mode.

Referring to FIGS. 5A and 9A, scan signals SLN1, SLN3, SLN5, ..., SLNn−3, and SLNn−1 provided to the scan lines SL1, SL3, SL5, ..., SLn−3, and SLn−1 during one frame section (e.g., a first frame section FM1a) are illustrated. Referring to FIGS. 5A and 9B, scan signals SLN2, SLN4, SLN6, ..., SLNn−2, and SLNn provided to the scan lines SL2, SL4, SL6, ..., SLn−2, and SLn during one frame section (e.g., a second frame section FM2a) are illustrated.

Referring to FIGS. 9A and 9B, during the first frame section FM1a, scan signals SLN1, SLN3, SLN5, ..., SLNn−3, and SLNn−1 may be provided to odd-numbered rows of scan lines SL1, SL3, SL5, ..., SLn−3, and SLn−1, and during the second frame section FM2a, scan signals SLN2, SLN4, SLN6, ..., SLNn−2, and SLNn may be provided to even-numbered rows of scan lines SL2, SL4, SL6, ..., SLn−2, and SLn. The scan lines SL1, SL3, SL5, ..., SLn−3, and SLn−1 of odd-numbered rows may be referred to as first scan lines SL1, SL3, SL5, ..., SLn−3, and SLn−1, and the scan lines SL2, SL4, SL6, ..., SLn−2, and SLn of even-numbered rows may be referred to as second scan lines SL2, SL4, SL6, ..., SLn−2, and SLn.

The display driver 100C (e.g., refer to FIG. 5A) may provide the first scan signals SLN1, SLN3, SLN5, ..., SLNn−3, and SLNn−1 to the first scan lines SL1, SL3, SL5, ..., SLn−3, and SLn−1, respectively, in the first frame section FM1a and provide the second scan signals SLN2, SLN4, SLN6, ..., SLNn−2, and SLNn to the second scan lines SL2, SL4, SL6, ..., SLn−2, and SLn, respectively, in the second frame section FM2a.

The pixels connected to the first scan lines SL1, SL3, SL5, ..., SLn−3, and SLn−1 may be charged with a voltage corresponding to the grayscale voltage supplied through data lines DL1 to DLm during the first frame section FM1a, and the pixels connected to the second scan lines SL2, SL4, SL6, ..., SLn−2, and SLn may be charged with a voltage corresponding to the grayscale voltage supplied through the data lines DL1 to DLm during the second frame section FM2a. In one embodiment, the term "corresponding" may indicate a similar level. For example, when a grayscale voltage is 5 V, a voltage corresponding to the grayscale voltage charged in the pixel may be 4.8 V. Thus, there may be some predetermined tolerance between the voltage corresponding to the grayscale voltage and the grayscale voltage. However, this is only an example and is not particularly limited thereto.

Display areas in which the grayscale voltage is not updated during the first frame section FM1a in FIG. 9A and display areas in which the grayscale voltage is not updated during the second frame section FM2a in FIG. 9B may be displayed in gray shades. In relation to the electronic device 1000, the entire image may be implemented by pixels of odd-numbered rows charged in the first frame section FM1a and pixels of even-numbered rows charged in the second frame section FM2. Accordingly, when the display layer 100 operates in the second display mode, the second frame frequency rate may be lower than the first frame frequency rate when the display layer 100 operates in the first display mode. For example, if the first frame frequency rate is 120 Hz, the second frame frequency rate may be 60 Hz.

Figure 10A:
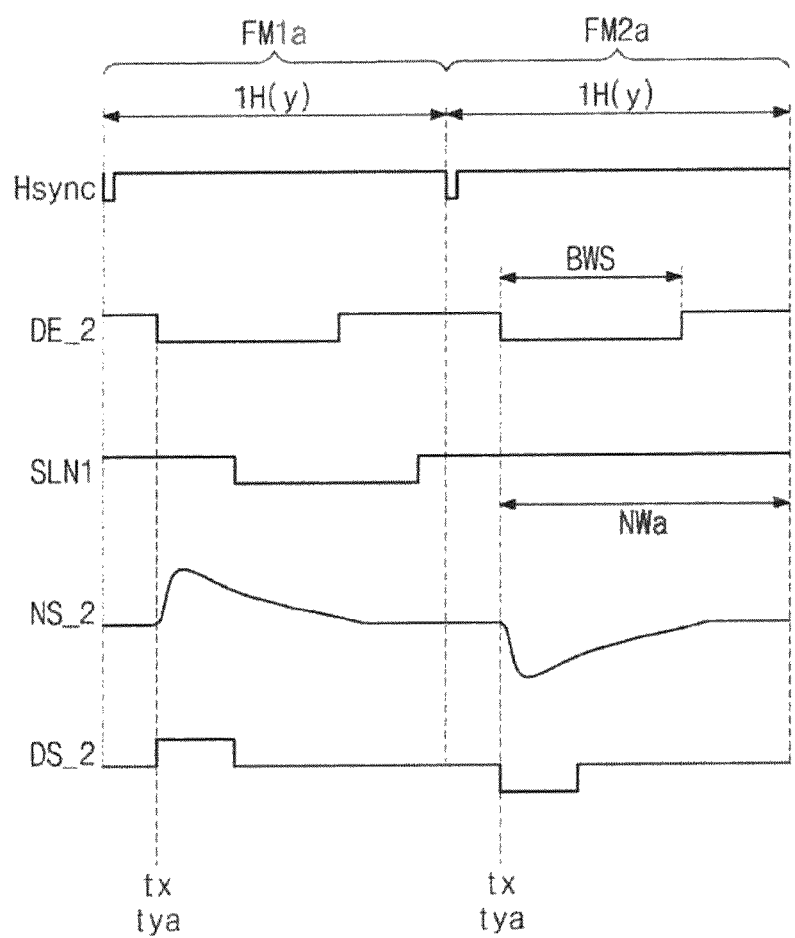
FIGS. 10A and 10B illustrate embodiments of a waveform diagram including signals of an electronic device.
Figure 10B:
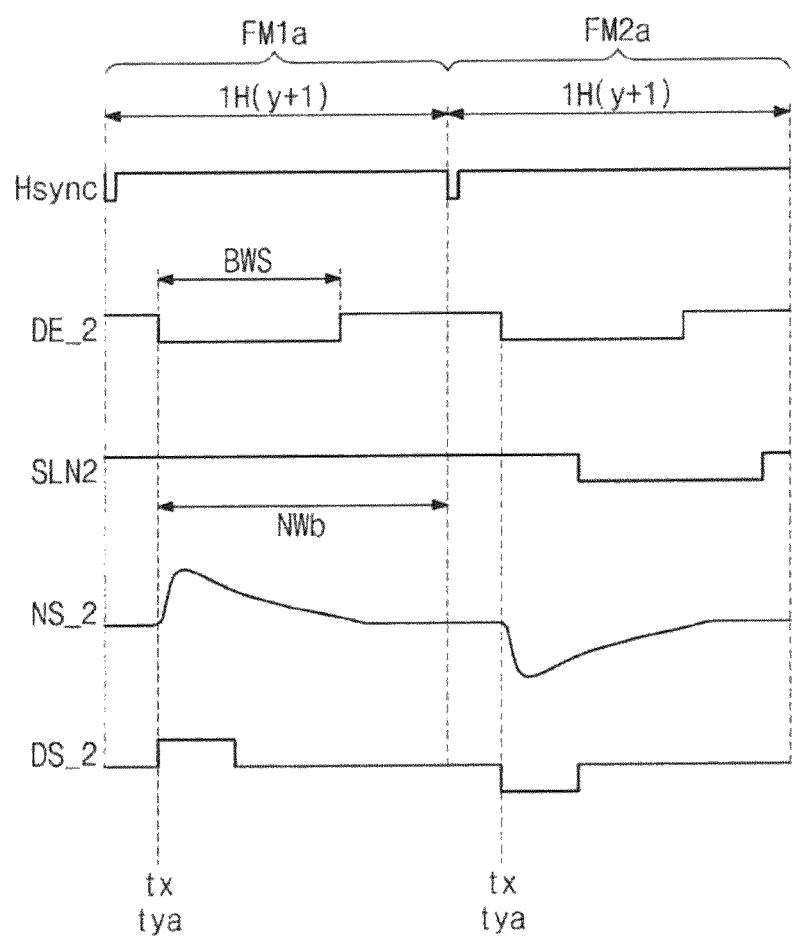

FIG. 10A is a waveform diagram showing an embodiment of a horizontal synchronization signal, an output control signal, a scan signal, a noise signal, and a driving signal. FIG. 10B is a waveform diagram showing an embodiment of a horizontal synchronization signal, an output control signal, a scan signal, a noise signal, and a driving signal.

FIGS. 10A and 10B show example waveforms of a horizontal synchronization signal Hsync, an output control signal DE_2, a scan signal SLN1 or SLN2, a noise signal NS_2, and a driving signal DS_2 to describe the second sensing mode of the sensor driver 200C. When the display driver 100C (e.g., refer to FIG. 2) is driven in the second display mode, the sensor driver 200C may be operated in the second sensing mode.

FIG. 10A illustrates signals output in a first horizontal period 1H(y) at substantially the same time point in a first frame section FM1a and a second frame section FM2a. For example, FIG. 10A illustrates signals output in the y-th horizontal period 1H(y) of each of the first frame section FM1a and second frame section FM2a.

FIG. 10B illustrates signals output in a first horizontal period 1H(y+1) after the first horizontal period 1H(y) shown in FIG. 10A. For example, FIG. 10B shows signals output in the (y+1)-th first horizontal period 1H(y+1) of each of the first frame section FM1a and the second frame section FM2a.

The scan signal SLN1 shown in FIG. 10A is a scan signal provided to the scan lines of odd-numbered rows and may be referred to as a first scan signal SLN1, and the scan signal SLN2 shown in FIG. 10B is a scan signal provided to the scan lines of even-numbered rows and is hereinafter referred to as a second scan signal SLN2.

Referring to FIGS. 6, 9A and 10A, the first scan signal SLN1 may be provided to the first scan line SL1 (e.g., see FIG. 5A) in the first frame section FM1a and may not be provided to the first scan line SL1 in the second frame section FM2a. Providing the first scan signal SLN1 may include the case where the waveform of the first scan signal SLN1 is changed. For example, when the first scan signal SLN1 is provided, the pixel may be charged with a grayscale voltage. In one embodiment, when the level of the first scan signal SLN1 is a first (e.g., low) level, the grayscale voltage provided to the data lines DL1 to DLm may be provided to the pixel. Accordingly, pixels connected to the scan line to which the first scan signal SLN1 is provided in the first frame section FM1a may be charged with a voltage corresponding to the grayscale voltage.

The first scan signal SLN1 may not be provided in the second frame section FM2a. In one embodiment, the first scan signal SLN1 may maintain a second (e.g., high) level. For example, during the second frame section FM2a, pixels connected to the scan lines of odd-numbered rows may not be newly charged with a grayscale voltage. In addition, in the y-th first horizontal period 1H(y) of the second frame section FM2a, each level of other scan signals provided to scan lines of odd-numbered rows and other scan signals provided to scan lines of even-numbered rows in addition to the first scan signal SLN1 may also be kept at a high level.

In one embodiment, in the y-th first horizontal period 1H(y) of the second frame section FM2a, one or more of the pixels PX may not be newly charged with a voltage corresponding to the grayscale voltage. This may correspond to a charging off section NWa. In this case, in the charging off section NWa, the data driving circuit 100C3 may output a grayscale voltage to the data lines DL1 to DLm. For example, in the section where the display layer 100 (e.g., refer to FIG. 2) does not update the screen, the data driving circuit 100C3 may output a grayscale voltage to data lines DL1 to DLm. In the y-th first horizontal period 1H(y) of the second frame section FM2a, the grayscale voltage output during the section BWS in which the output control signal DE_2 maintains the low level may be a black grayscale voltage or a white grayscale voltage. This may be the highest or lowest voltage among the grayscale voltages. These features may be understood, for example, with reference to the embodiment of FIG. 5A.

Referring to FIGS. 6, 9B and 10B, the second scan signal SLN2 may be provided to the second scan line SL2 (e.g., see FIG. 5A) in the second frame section FM2a and may not be provided to the second scan line SL2 in the first frame section FM1a. When the level of the second scan signal SLN2 is a first (e.g., low) level, a grayscale voltage provided to the data lines DL1 to DLm may be provided to the pixel. Accordingly, pixels connected to the scan line to which the second scan signal SLN2 is provided in the second frame section FM2a may be charged with a voltage corresponding to the grayscale voltage.

The second scan signal SLN2 may not be provided in the first frame section FM1a. In one embodiment, the second scan signal SLN2 may maintain a second (e.g., high) level. For example, during the first frame section FM1a, the pixels connected to the scan lines of even-numbered rows may not be newly charged with the grayscale voltage. In addition, in the (y+1)-th first horizontal period 1H(y+1) of the first frame section FM1a, each level of other scan signals provided to scan lines of even-numbered rows and other scan signals provided to scan lines of odd-numbered rows in addition to the second scan signal SLN2 may also be kept at a high level.

In one embodiment, in the (y+1)-th first horizontal period 1H(y+1) of the first frame section FM1a, one or more of the pixels PX (e.g., refer to FIG. 5A) may not be newly charged with a voltage corresponding to the grayscale voltage, and this may correspond to a charging off section NWb. In the charging off section NWb, the data driving circuit 100C3 (e.g., refer to FIG. 5A) may output a grayscale voltage to the data lines DL1 to DLm.

The second electrode CE (e.g., see FIG. 4) may be coupled to data lines DL1 to DLm. In this case, the potential of the second electrode CE may be shaken by a change in the potential of the grayscale voltages provided to the data lines DL1 to DLm. These features may be understood, for example, with reference to FIG. 5A.

The noise signal NS_2 may be a potential of the second electrode CE. In one embodiment, the noise signal NS_2 may change by a relatively large amount at a timing when the level of the output control signal DE_1 changes. When operating in the second display mode, a maximum grayscale voltage or a minimum grayscale voltage that is not charged to the pixels PX (e.g., see FIG. 5A) may be provided to the data lines DL1 to DLm. The noise signal NS_2 is affected by a grayscale voltage that does not charge the pixels PX. For example, the noise signal NS_2 may be controlled to have a predetermined regularity by controlling the grayscale voltage provided to the display layer 100.

In one embodiment, the timing at which the sensor driver 200C senses the external input may be determined based on the timing at which the grayscale voltage is output. For example, the level change time point tx of the output control signal DE_2 and the output time point tya of the driving signal DS_2 may be substantially the same. However, the inventive concept is not limited thereto. For example, the time interval between the level change time point tx of the output control signal DE_2 and the output time point tya of the driving signal DS_2 may be less than the first time td1 (see FIG. 8) in the first sensing mode.

According to an embodiment of the inventive concept, in the second sensing mode, the sensor driver 200C may be driven according to a timing at which the level of the noise signal NS_2 changes significantly, e.g., above a predetermined value. For example, the sensor driver 200C may output the driving signal DS_2 to the sensor layer 200 at a timing when the level of the noise signal NS_2 changes significantly, e.g., above a predetermined value.

In some cases, the waveform of the driving signal DS_2 may have a shape similar to that of the noise signal NS_2. For example, when the driving signal DS_2 has a rising edge, the data driving circuit 100C3 (e.g., refer to FIG. 5A) may output a white grayscale voltage to the data lines DL1 to DLm. In this case, the noise signal NS_2 may have an increased potential level similar to the driving signal DS_2 having a rising edge. In addition, when the driving signal DS_2 has a falling edge, the data driving circuit 100C3 (e.g., refer to FIG. 5A) may output a black grayscale voltage to the data lines DL1 to DLm. In this case, the noise signal NS_2 may have a decreased potential level similar to the driving signal DS_2 having a falling edge. Thus, the noise signal NS_2 may serve as a charge pump that boosts or reduces the potential of the driving signal DS_2.

When the noise signal NS_2 has a waveform similar to that of the driving signal DS_2, as the driving signal DS_2 and the noise signal NS_2 are interlocked, the waveform of the driving signal DS_2 may resemble a square wave in some respects. Sensitivity to an external input may be improved as the waveform of the driving signal DS_2 approaches a square wave. As the sensitivity of the sensor layer 200 is improved, the second sensing mode may function as a proximity sensing mode that detects an object (e.g., hovering object) separated from the surface 1000SF of the electronic device 1000 (e.g., see FIG. 2). Thus, the sensor layer 200 operating in the second sensing mode may be used as a proximity sensor. As a result, a proximity sensor used in other types of devices may be omitted from the electronic device 1000. Accordingly, manufacturing costs of electronic device 1000 may be reduced.

In addition, even if the potential of the drive signal DS_2 is boosted or reduced, while the driving signal DS_2 is provided to the sensor layer 200 (e.g., see FIG. 2), the voltage corresponding to the grayscale voltage is not charged in the pixels PX (e.g., refer to FIG. 5A). Accordingly, even if the signal provided to the sensor layer 200 is boosted or reduced, the quality of the image displayed on the display layer 100 (e.g., refer to FIG. 2) may not be affected.

Figure 11A:
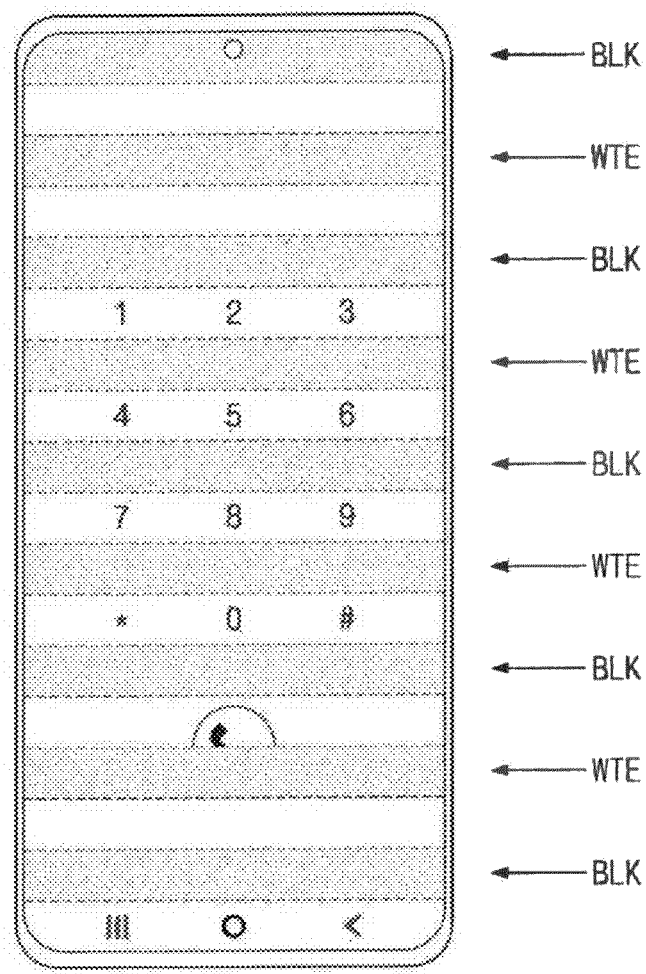
FIGS. 11A and 11B illustrate embodiments of an electronic device.
Figure 11A:
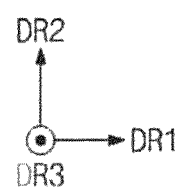

FIG. 11A is a diagram illustrating a grayscale voltage applied to data lines in one frame according to an embodiment.

Referring to FIG. 11A, a grayscale voltage output in one horizontal period having a charging off section is illustrated as an example. The gray shaded portion may be a section corresponding to the charging off section NWa or NWb (e.g., see FIG. 10A or 10B). For example, the data driving circuit 100C3 (e.g., refer to FIG. 5A) may output a black grayscale voltage BLK in a first charging off section and output a white grayscale voltage WTE in a second charging off section. Thus, the black grayscale voltage BLK and the white grayscale voltage WTE may be alternately output once. The black grayscale voltage BLK or the white grayscale voltage WTE output from each charge-off section may be provided to the entire data lines DL1 to DLm.

Figure 11B:
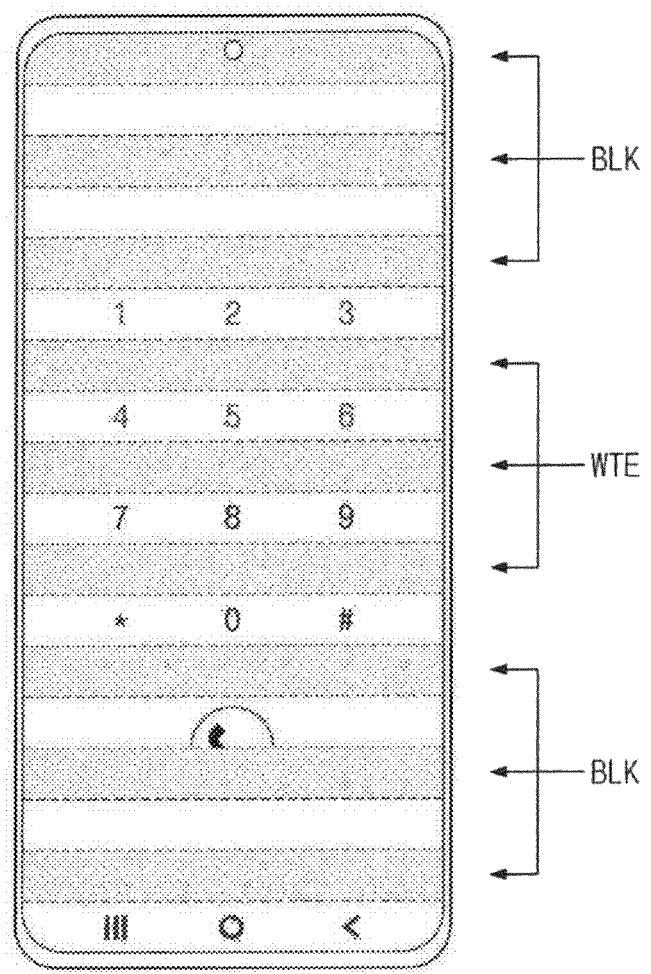

FIG. 11B is a diagram illustrating a grayscale voltage applied to data lines in one frame according to an embodiment. Referring to FIG. 11B, the data driving circuit 100C3 (e.g., refer to FIG. 5A) may output a black grayscale voltage BLK to a plurality of charging off sections, and may output a white grayscale voltage WTE to the next plurality of charging off sections.

Figure 12:
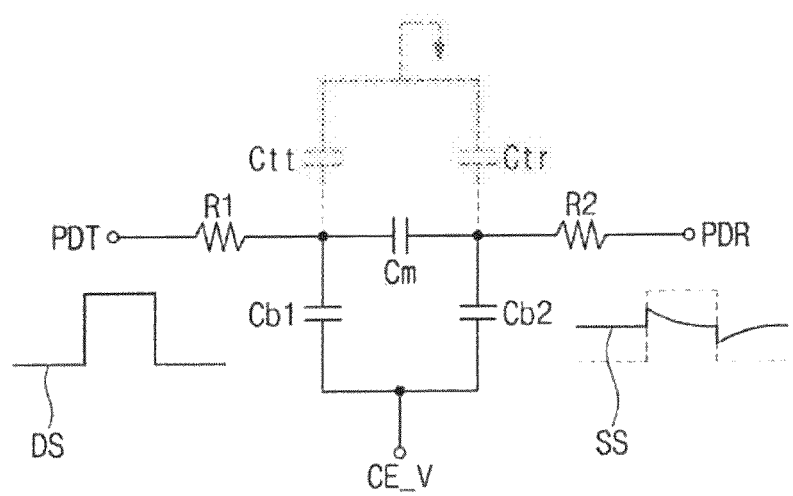
FIG. 12 illustrates an embodiment of an equivalent circuit diagram of a sensor layer in a state in which a touch event occurs.

FIG. 12 is an equivalent circuit diagram of an embodiment of a sensor layer in a state in which a touch event occurs.

Referring to FIGS. 4, 6 and 12, the following is illustrated: a capacitance Cb1 between the second electrode CE and the electrode 210, a capacitance Cb2 between the second electrode CE and the cross electrode 220, a mutual capacitance Cm between the electrode 210 and the cross electrode 220, a capacitance Ctt (e.g., a touch capacitance) between the input 2000 or 3000 (e.g., see FIG. 2) and the electrode 210, a capacitance Ctr (e.g., touch capacitance) between the input 2000 or 3000 and the cross electrode 220, an equivalent resistance R1 formed between the input pad PDT and the electrode 210, and an equivalent resistance R2 formed between the output pad PDR and the cross electrode 220. The driving signal DS may be input to the input pad PDT and the detection signal SS may be output to the output pad PDR.

Touch capacitances Ctt and Ctr may increase as the distance between the input 2000 or 3000 and the sensor layer 200 decreases. The touch capacitances Ctt and Ctr between the sensor layer 200 (e.g., refer to FIG. 2) and the input 3000 may be less than the touch capacitances Ctt and Ctr between the sensor layer 200 and the input 2000. Therefore, to detect the input 3000, the sensitivity of the sensor layer 200 can be improved according to one or more embodiments. The voltage CE_V of the second electrode CE (e.g., refer to FIG. 4) is coupled with the data lines DL1 to DLm, so that the potential may change. In the second sensing mode (or proximity sensing mode), the voltage CE_V of the second electrode CE may fluctuate to have a waveform similar to that of the driving signal DS. In this case, the driving signal DS may be interlocked with the voltage CE_V of the second electrode CE, and the waveform of the driving signal DS may be an approximate square wave. As the waveform of the driving signal DS approaches a square wave, the sensing sensitivity to the external input 3000 may be improved.

Figure 13:
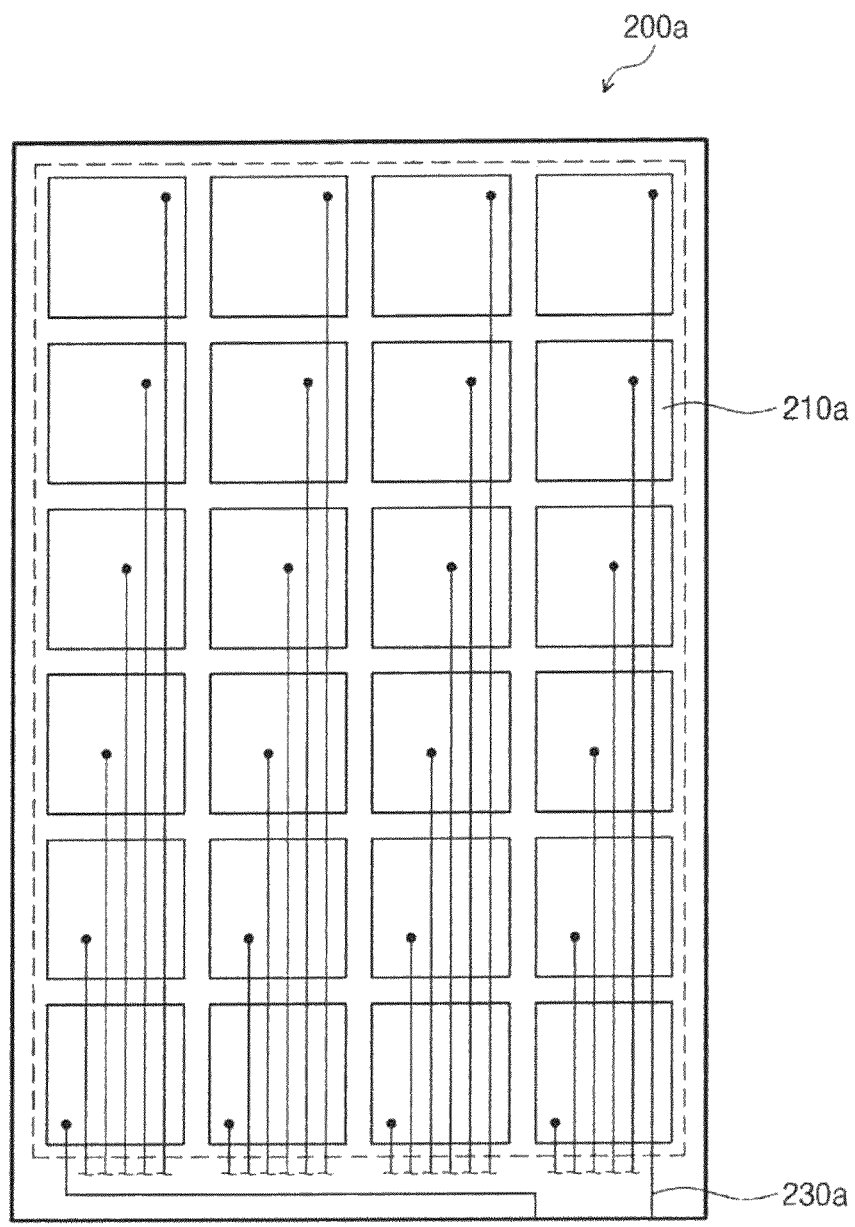
FIG. 13 illustrates an embodiment of a sensor layer.
Figure 14:
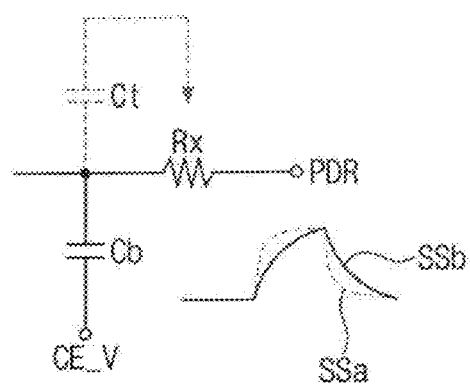
FIG. 14 illustrates an embodiment of an equivalent circuit diagram of a sensor layer in a state in which a touch event occurs.

FIG. 13 is a plan view of sensor layer 200a according to an embodiment of the inventive concept. FIG. 14 is an equivalent circuit diagram of an embodiment of sensor layer 200a in a state in which a touch event occurs.

Referring to FIGS. 13 and 14, in this embodiment the sensor layer 200a may be a self-capacitive sensor layer 200a including sensing electrodes 210a and lines 230a connected to the sensing electrodes 210a, respectively. The sensing electrodes 210a may be arranged along the first direction DR1 and the second direction DR2. The sensing electrodes 210a in FIG. 13 have a quadrangular shape, but may have a different shape in another embodiment.

FIG. 14 shows an example of a parasitic capacitance Cb between the sensing electrode 210a and second electrode CE (e.g., refer to FIG. 4), a touch capacitance Ct between the sensing electrode 210a and input 2000 or 3000 (e.g., refer to FIG. 2), and an equivalent resistance Rx between the pad PDR and the sensing electrode 210a.

The touch capacitance Ct may increase as the distance between the input 2000 or 3000 and the sensor layer 200 decreases. The touch capacitance Ct between the sensor layer 200 and the input 3000 may be less than the touch capacitance Ct between the sensor layer 200 and the input

2000. Therefore, to detect the input 3000, the sensitivity of the sensor layer 200a can be improved according to one or more embodiments.

In FIG. 14, a detection signal SSa (e.g., a first detection signal) before the input 2000 or 3000 is input and a detection signal SSb (e.g., a second detection signal) after the input 2000 or 3000 is input are shown as an example.

The voltage CE_V of the second electrode CE (e.g., refer to FIG. 4) is coupled with the data lines DL1 to DLm, so that the potential may change. In the second sensing mode (or proximity sensing mode), the voltage CE_V of the second electrode CE may fluctuate to have a waveform similar to that of the first detection signal SSa. The first detection signal SSa may be interlocked with the voltage CE_V of the second electrode CE, and the waveform of the first detection signal SSa may be close to a square wave. As the waveform of the first detection signal SSa approaches the square wave, the difference between the first detection signal SSa and the second detection signal SSb may increase, and thus sensing sensitivity to an external input 3000 (refer to FIG. 2) may be improved.

Figure 15:
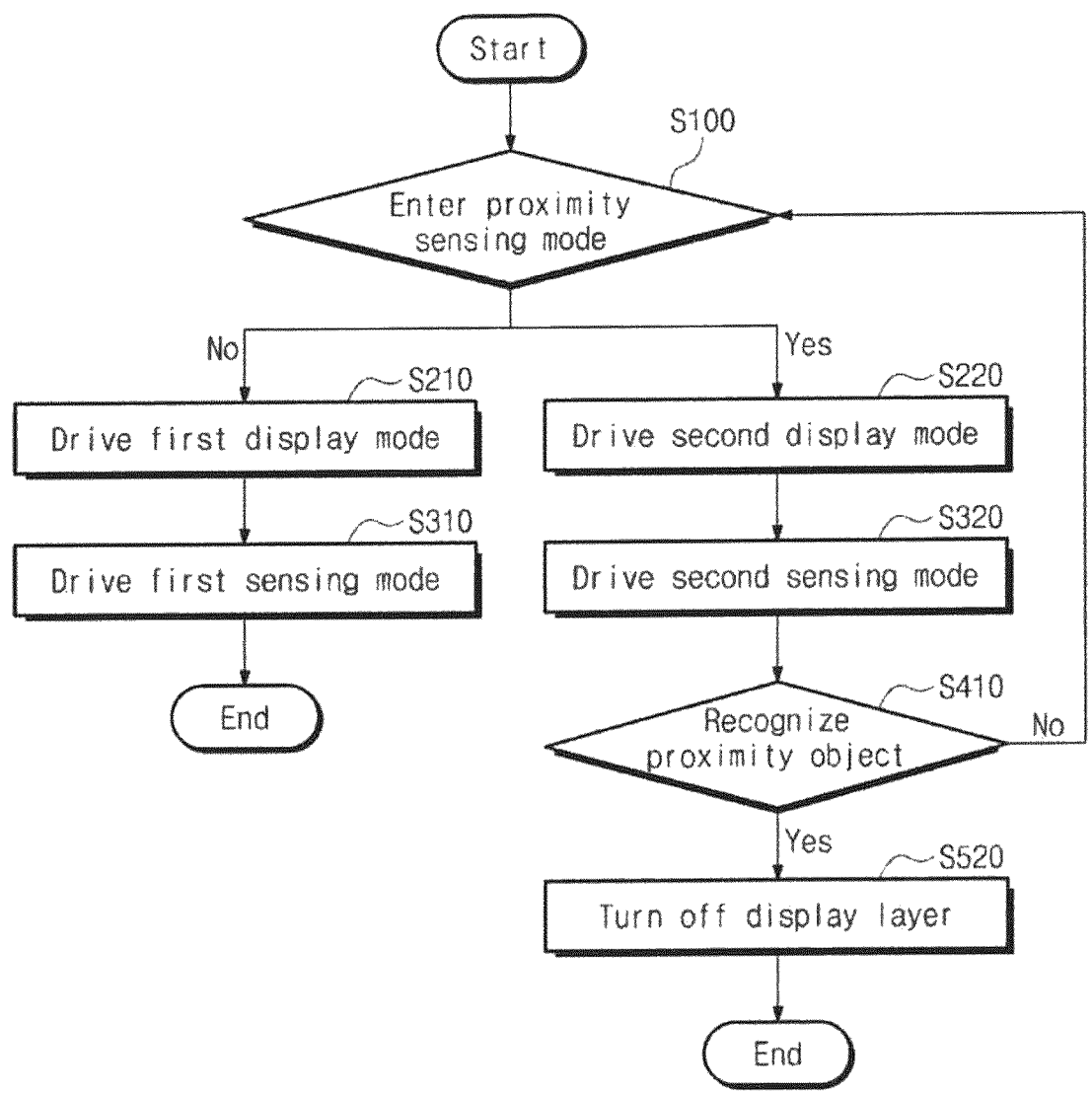
FIG. 15 illustrates an embodiment of a method of controlling an electronic device.

FIG. 15 is a flowchart illustrating a method of controlling an electronic device according to an embodiment of the inventive concept.

Referring to FIGS. 2 and 15, the main driver 1000C determines whether the electronic device 1000 enters the proximity sensing mode (S100). For example, when the user touches the dial screen, the main driver 1000C may determine that a proximity sensing mode is to be driven.

When the proximity sensing mode is not entered, the main driver 1000C may control the display driver 100C so that the display driver 100C is driven in the first display mode. The display driver 100C may be driven in the first display mode (S210). The first display mode may be the driving mode, for example, as described with reference to FIGS. 7 and 8. In one embodiment, the frame rate of the display layer 100 may be 120 Hz in the first display mode. When the display driver 100C is driven in the first display mode, the sensor driver 200C may be driven in the first sensing mode (S310).

When entering the proximity sensing mode, the main driver 1000C may control the display driver 100C so that the display driver 100C is driven in the second display mode. The display driver 100C may be driven in the second display mode (S220). The second display mode may be the driving mode described with reference to FIGS. 9A, 9B, 10A, and 10B. In the second display mode, the frame rate of the display layer 100 may be 60 Hz. When the display driver 100C is driven in the second display mode, the sensor driver 200C may be driven in the second sensing mode (S320).

The sensor driver 200C determines whether a proximity object is recognized through the sensor layer 200 having improved sensitivity (S410). For example, the sensor driver 200C may provide a proximity signal I-NS having proximity object detection information to the main driver 1000C. The main driver 1000C may operate the display driver 100C to reduce the luminance of an image displayed on the display layer 100 or not to display an image on the display layer based on the proximity signal I-NS. For example, the main driver 1000C may turn off the display layer 100 (S520).

Figure 16:
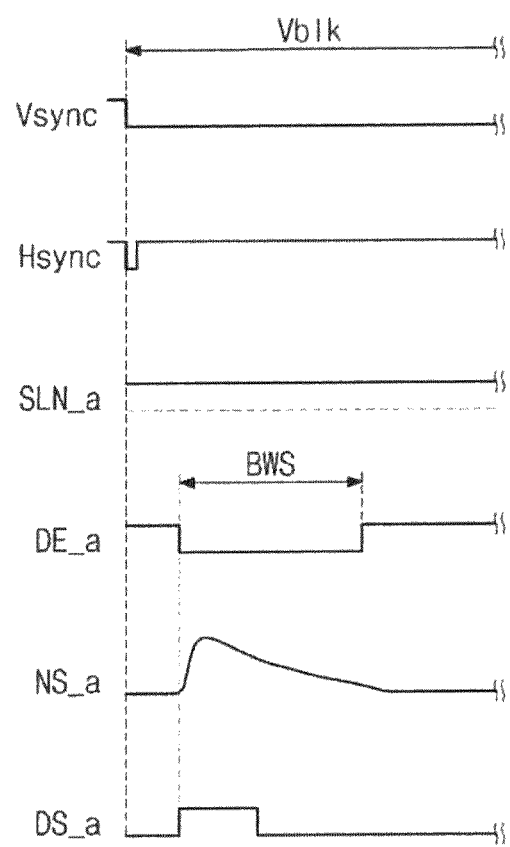
FIG. 16 illustrates an embodiment of a waveform diagram including signals of an electronic device.

FIG. 16 is a waveform diagram showing an embodiment of a vertical synchronization signal, a horizontal synchronization signal, a scan signal, an output control signal, a noise signal, and a driving signal.

Referring to FIGS. 2, 5A and 16, a vertical blank section Vblk having a low level of the vertical synchronization signal Vsync is illustrated.

During the vertical blank section Vblk, the scan signal SLN_a may not be provided. Accordingly, the pixels PX may maintain a state in which they are not charged with a voltage corresponding to the grayscale voltage.

During the section BWS where the output control signal DE_a in the vertical blank section Vblk remains at a low level, the data driving circuit 100C3 may provide a grayscale voltage to the data lines DL1 to DLm. The grayscale voltage may be a minimum grayscale voltage or a maximum grayscale voltage. For example, the minimum grayscale voltage may be a black grayscale voltage and the maximum grayscale voltage may be a white grayscale voltage.

The noise signal NS_a may change by a relatively large amount at a timing when the level of the output control signal DE_a changes. As the maximum grayscale voltage or the minimum grayscale voltage that is not charged to the pixels is provided to the data lines DL1 to DLm, the level of the noise signal NS_a may be changed. The timing at which the sensor driver 200C senses the external input may be determined based on the timing at which the grayscale voltage is output. For example, the sensor driver 200C may output the driving signal DS_a to the sensor layer 200 at a timing when the level of the noise signal NS_a changes significantly, by a predetermined amount.

When the noise signal NS_a has a waveform similar to that of the driving signal DS_a, as the driving signal DS_a and the noise signal NS_a are interlocked, the waveform of the driving signal DS_a may become closer to a square wave. Sensitivity to an external input may be improved as the waveform of the driving signal DS_a approaches a square wave. In the vertical blank section Vblk, the sensor layer 200 may function in a proximity sensing mode that detects an object (e.g., hovering object) spaced from the surface 1000SF of the electronic device 1000 (e.g., see FIG. 2).

In accordance with one or more embodiments of the inventive concept, a sensor driver may be operated in synchronization with the display driver. The sensor driver may use noise generated from the display layer. For example, the sensor driver may operate in a first sensing mode or a second sensing mode having different operation timings. In the second sensing mode, the noise signal generated from the display layer may have a waveform similar to that of a signal provided to the sensor layer. In this case, the driving signal and the noise signal are interlocked with each other, so that the waveform of the driving signal may be close to a square wave. As the waveform of the driving signal approaches the square wave, the sensitivity to an external input may be improved. As the sensitivity of the sensor layer is improved, the second sensing mode may function as a proximity sensing mode that detects an object (hovering object) spaced from the surface of the electronic device. That is, the sensor layer operating in the second sensing mode may be used as a proximity sensor. In this case, the proximity sensor may be omitted from the electronic device, and accordingly, the manufacturing cost of the electronic device may be reduced.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. An electronic device, comprising:
   a display layer including a plurality of scan lines, a plurality of data lines, and a plurality of pixels;

a display driver configured to drive the display layer and provide a grayscale voltage to the plurality of data lines and is configured to provide a scan signal differently in different modes of operation;

a sensor layer disposed on the display layer; and a sensor driver configured to be synchronized with the display driver to drive the sensor layer, wherein the sensor driver is configured to operate in a first sensing mode and a second sensing mode and wherein:

in the first sensing mode, the sensor driver is configured to sense an input through the sensor layer based on a first timing, and in the second sensing mode, the sensor driver is configured to sense an input through the sensor layer based on a second timing different from the first timing, and when the sensor driver is driven in the second sensing mode, the grayscale voltage is provided to the plurality of data lines and one or more of the plurality of pixels are not charged with a voltage corresponding to the grayscale voltage.

2. The electronic device of claim 1, wherein:

the display driver is configured to operate in a first display mode or a second display mode different from the first display mode, in the first display mode, the display driver is configured to provide a scan signal to the plurality of scan lines in one frame section, in the second display mode, the display driver is configured to provide a scan signal to a plurality of first scan lines among the plurality of scan lines in a first frame section and to provide a scan signal to a plurality of second scan lines among the plurality of scan lines in a second frame section.

3. The electronic device of claim 2, wherein, in the first display mode, the plurality of pixels are charged with a voltage corresponding to the grayscale voltage.

4. The electronic device of claim 2, wherein:

the plurality of pixels comprise a plurality of first pixels connected to the plurality of first scan lines and a plurality of second pixels connected to the plurality of second scan lines, in the second display mode, the plurality of first pixels are charged according to the grayscale voltage during the first frame section and the plurality of second pixels are not charged with the grayscale voltage during the first frame section.

5. The electronic device of claim 4, wherein in the second display mode:

the plurality of first pixels are not charged with the grayscale voltage during the second frame section, and the plurality of second pixels are charged according to the grayscale voltage during the second frame section.

6. The electronic device of claim 4, wherein in the second display mode:

a grayscale voltage provided to the plurality of second pixels during the first frame section and a grayscale voltage provided to the plurality of first pixels during the second frame section are a black grayscale voltage or a white grayscale voltage.

7. The electronic device of claim 1, wherein:

the display driver is configured to output the grayscale voltage to the plurality of data lines in response to a level change time point of an output control signal, a time interval between a timing at which the sensing driver outputs a driving signal to the sensor layer and the level change time point in the first sensing mode is greater than a time interval between a timing at which the sensing driver outputs a driving signal to the sensor layer and the level change time point in the second sensing mode.

8. The electronic device of claim 1, wherein:

the display driver is configured to output the grayscale voltage to the plurality of data lines in response to a level change time point of an output control signal, in the second sensing mode, a timing at which the sensing driver outputs a driving signal to the sensor layer and the level change time point are substantially same.

9. The electronic device of claim 1, wherein:

when the sensor driver is driven in the second sensing mode, the grayscale voltage is a black grayscale voltage or a white grayscale voltage.

10. The electronic device of claim 1, wherein:

in the second sensing mode, the sensor driver is configured to provide a driving signal to the sensor layer in a section having a largest noise by the display layer.

11. The electronic device of claim 1, wherein the second sensing mode is a proximity sensing mode that detects an object spaced from a surface of the electronic device.

12. The electronic device of claim 1, wherein the display layer further comprises:

a base layer;

a circuit layer disposed on the base layer;

a light emitting element layer disposed on the circuit layer; and a encapsulation layer disposed on the light emitting element layer to seal the light emitting element layer, wherein the sensor layer is disposed in direct contact with the encapsulation layer.

13. An electronic device comprising:

a display layer including a plurality of scan lines, a plurality of data lines, and a plurality of pixels;

a display driver configured to drive the display layer and provide a grayscale voltage to the plurality of data lines;

a sensor layer disposed on the display layer; and a sensor driver configured to be synchronized with the display driver to drive the sensor layer, wherein the sensor driver is configured to operate in a first sensing mode and a second sensing mode and wherein:

in the first sensing mode, the sensor driver is configured to sense an input through the sensor layer based on a first timing, in the second sensing mode, the sensor driver is configured to sense an input through the sensor layer based on a second timing different from the first timing, the display driver is configured to receive a vertical synchronization signal, and the sensor driver is configured to operate in the second sensing mode in a vertical blank section of the vertical synchronization signal.

14. The electronic device of claim 13, wherein the display driver is configured to output a black grayscale voltage or a white grayscale voltage to the plurality of data lines in the vertical blank section.

15. An electronic device, comprising:

a display layer configured to display an image and including a plurality of scan lines, a plurality of data lines, and a plurality of pixels;

a display driver configured to drive the display layer;

a sensor layer disposed on the display layer; and a sensor driver configured to be synchronized with the display driver and driven in a first sensing mode or a second sensing mode having different timings for sensing an external input from the sensor layer, wherein the display driver is configured to output a grayscale voltage to the plurality of data lines in response to a level change time point of an output control signal, and wherein a time interval between a timing of sensing the external input and a level change time point in the first sensing mode is greater than a time interval between a timing of sensing the external input and a level change time point in the second sensing mode.

16. The electronic device of claim 15, wherein:

the display driver is configured to be driven in a first display mode operating at a first frame rate and a second display mode operating at a second frame rate lower than the first frame rate, the first sensing mode synchronized with the first display mode and the second sensing mode synchronized with the second display mode.

17. The electronic device of claim 16, wherein:

in the first display mode, the display driver is configured to provide a scan signal to a plurality of scan lines of the display layer in one frame section, in the second display mode, the display driver is configured to provide a scan signal to a plurality of first scan lines among the plurality of scan lines in a first frame section and to provide a scan signal to a plurality of second scan lines among the plurality of scan lines in a second frame section.

18. The electronic device of claim 17, wherein:

the plurality of pixels comprise a plurality of first pixels connected to the plurality of first scan lines and a plurality of second pixels connected to the plurality of second scan lines, in the second display mode, the plurality of first pixels are charged according to the grayscale voltage during the first frame section and the plurality of second pixels are not charged with the grayscale voltage during the first frame section, in the second display mode, the plurality of first pixels are not charged with the grayscale voltage during the second frame section and the plurality of second pixels are charged according to the grayscale voltage during the second frame section.

19. The electronic device of claim 15, wherein:

the display driver is configured to receive a vertical synchronization signal, and the sensor driver is configured to operate in the second sensing mode in a vertical blank section of the vertical synchronization signal.

* * * * *